United States Patent
Hietala et al.

(10) Patent No.: US 9,515,621 B2
(45) Date of Patent: Dec. 6, 2016

(54) MULTIMODE RF AMPLIFIER SYSTEM

(71) Applicant: RF Micro Devices, Inc., Greensboro, NC (US)

(72) Inventors: Alexander Wayne Hietala, Phoenix, AZ (US); Jeffery Peter Ortiz, Chandler, AZ (US); David Halchin, Summerfield, NC (US); Jackie Johnson, Trinity, NC (US); Wendel Charles, Winston-Salem, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 13/689,883

(22) Filed: Nov. 30, 2012

(65) Prior Publication Data

US 2013/0135043 A1 May 30, 2013

Related U.S. Application Data

(60) Provisional application No. 61/564,967, filed on Nov. 30, 2011.

(51) Int. Cl.
*H03F 3/21* (2006.01)
*H03F 3/68* (2006.01)
(Continued)

(52) U.S. Cl.
CPC .......... *H03F 3/211* (2013.01); *H03F 1/0277* (2013.01); *H03F 3/195* (2013.01); *H03F 3/245* (2013.01); *H03F 3/72* (2013.01); *H03F 2200/429* (2013.01); *H03F 2200/507* (2013.01); *H03F 2200/537* (2013.01);
(Continued)

(58) Field of Classification Search
USPC .............................. 330/124 R, 295, 297, 126
See application file for complete search history.

(56) References Cited

U.S. PATENT DOCUMENTS 3,969,682 A 7/1976 Rossum
3,980,964 A 9/1976 Grodinsky
(Continued)

FOREIGN PATENT DOCUMENTS

CN 1076567 A 9/1993
CN 1211355 A 3/1999
(Continued)

OTHER PUBLICATIONS

Notice of Allowance for U.S. Appl. No. 14/022,858, mailed Oct. 25, 2013, 9 pages.
(Continued)

*Primary Examiner* — Hieu Nguyen
(74) *Attorney, Agent, or Firm* — Withrow & Terranova, P.L.L.C.

(57) ABSTRACT

Multimode radio frequency (RF) amplifier systems and techniques are disclosed. In one embodiment, a multimode radio frequency (RF) amplifier system has a first RF amplifier and a second RF amplifier. The first RF amplifier may support a first RF communication standard. The second RF amplifier may support a second RF communication standard. The first RF amplifier includes an auxiliary circuit. The auxiliary circuit may provide a service or a utility to a second RF amplifier. For example, the auxiliary circuit may generate a supply voltage to power the second RF amplifier.

33 Claims, 8 Drawing Sheets

(51) Int. Cl.
  *H03F 1/02* (2006.01)
  *H03F 3/195* (2006.01)
  *H03F 3/24* (2006.01)
  *H03F 3/72* (2006.01)

(52) U.S. Cl.
  CPC .............. *H03F 2203/21145* (2013.01); *H03F 2203/7209* (2013.01); *H03F 2203/7227* (2013.01)

(56) References Cited

U.S. PATENT DOCUMENTS

| | | |
|---|---|---|
| 4,587,552 A | 5/1986 | Chin |
| 4,692,889 A | 9/1987 | McNeely |
| 4,831,258 A | 5/1989 | Paulk et al. |
| 4,996,500 A | 2/1991 | Larson et al. |
| 5,099,203 A | 3/1992 | Weaver et al. |
| 5,146,504 A | 9/1992 | Pinckley |
| 5,187,396 A | 2/1993 | Armstrong, II et al. |
| 5,311,309 A | 5/1994 | Ersoz et al. |
| 5,317,217 A | 5/1994 | Rieger et al. |
| 5,339,041 A | 8/1994 | Nitardy |
| 5,351,087 A | 9/1994 | Christopher et al. |
| 5,414,614 A | 5/1995 | Fette et al. |
| 5,420,643 A | 5/1995 | Romesburg et al. |
| 5,457,620 A | 10/1995 | Dromgoole |
| 5,486,871 A | 1/1996 | Filliman et al. |
| 5,532,916 A | 7/1996 | Tamagawa |
| 5,541,547 A | 7/1996 | Lam |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tidemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow |
| 6,133,777 A | 10/2000 | Savelli |
| 6,141,541 A | 10/2000 | Midya et al. |
| 6,147,478 A | 11/2000 | Skelton et al. |
| 6,166,598 A | 12/2000 | Schlueter |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,400,775 B1 | 6/2002 | Gourgue et al. |
| 6,426,680 B1 | 7/2002 | Duncan et al. |
| 6,483,281 B2 | 11/2002 | Hwang |
| 6,559,689 B1 | 5/2003 | Clark |
| 6,566,935 B1 | 5/2003 | Renous |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,646,501 B1 | 11/2003 | Wessel |
| 6,658,445 B1 | 12/2003 | Gau et al. |
| 6,681,101 B1 | 1/2004 | Eidson et al. |
| 6,686,727 B2 | 2/2004 | Ledenev et al. |
| 6,690,652 B1 | 2/2004 | Sadri |
| 6,701,141 B2 | 3/2004 | Lam |
| 6,703,080 B2 | 3/2004 | Reyzelman et al. |
| 6,728,163 B2 | 4/2004 | Gomm et al. |
| 6,744,151 B2 | 6/2004 | Jackson et al. |
| 6,819,938 B2 | 11/2004 | Sahota |
| 6,885,176 B2 | 4/2005 | Librizzi |
| 6,958,596 B1 | 10/2005 | Sferrazza et al. |
| 6,995,995 B2 | 2/2006 | Zeng et al. |
| 7,038,536 B2 | 5/2006 | Cioffi et al. |
| 7,043,213 B2 | 5/2006 | Robinson et al. |
| 7,053,718 B2 | 5/2006 | Dupuis et al. |
| 7,058,373 B2 | 6/2006 | Grigore |
| 7,099,635 B2 | 8/2006 | McCune |
| 7,164,893 B2 | 1/2007 | Leizerovich et al. |
| 7,170,341 B2 | 1/2007 | Conrad et al. |
| 7,200,365 B2 | 4/2007 | Watanabe et al. |
| 7,233,130 B1 | 6/2007 | Kay |
| 7,253,589 B1 | 8/2007 | Potanin et al. |
| 7,254,157 B1 | 8/2007 | Crotty et al. |
| 7,262,658 B2 | 8/2007 | Ramaswamy et al. |
| 7,279,875 B2 | 10/2007 | Gan et al. |
| 7,304,537 B2 | 12/2007 | Kwon et al. |
| 7,348,847 B2 | 3/2008 | Whittaker |
| 7,394,233 B1 | 7/2008 | Trayling et al. |
| 7,405,618 B2 | 7/2008 | Lee et al. |
| 7,411,316 B2 | 8/2008 | Pai |
| 7,414,330 B2 | 8/2008 | Chen |
| 7,453,711 B2 | 11/2008 | Yanagida et al. |
| 7,454,238 B2 | 11/2008 | Vinayak et al. |
| 7,515,885 B2 | 4/2009 | Sander et al. |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 | 3/2010 | Li |
| 7,684,216 B2 | 3/2010 | Choi et al. |
| 7,696,735 B2 | 4/2010 | Oraw et al. |
| 7,715,811 B2 | 5/2010 | Kenington |
| 7,724,837 B2 | 5/2010 | Filimonov et al. |
| 7,755,431 B2 | 7/2010 | Sun |
| 7,764,060 B2 | 7/2010 | Wilson |
| 7,773,691 B2 | 8/2010 | Khlat et al. |
| 7,773,965 B1 | 8/2010 | Van Brunt et al. |
| 7,777,459 B2 | 8/2010 | Williams |
| 7,782,036 B1 | 8/2010 | Wong et al. |
| 7,783,269 B2 | 8/2010 | Vinayak et al. |
| 7,800,427 B2 | 9/2010 | Chae et al. |
| 7,805,115 B1 | 9/2010 | McMorrow et al. |
| 7,852,150 B1 | 12/2010 | Arknaes-Pedersen |
| 7,856,048 B1 | 12/2010 | Smaini et al. |
| 7,859,336 B2 | 12/2010 | Markowski et al. |
| 7,863,828 B2 | 1/2011 | Melanson |
| 7,880,547 B2 | 2/2011 | Lee et al. |
| 7,884,681 B1 | 2/2011 | Khlat et al. |
| 7,894,216 B2 | 2/2011 | Melanson |
| 7,898,268 B2 | 3/2011 | Bernardon et al. |
| 7,898,327 B2 | 3/2011 | Nentwig |
| 7,907,010 B2 | 3/2011 | Wendt et al. |
| 7,915,961 B1 | 3/2011 | Li |
| 7,917,105 B2 | 3/2011 | Drogi et al. |
| 7,920,023 B2 | 4/2011 | Witchard |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 | 9/2011 | Giovannotto |
| 8,044,639 B2 | 10/2011 | Tamegai et al. |
| 8,054,126 B2 | 11/2011 | Yang et al. |
| 8,068,622 B2 | 11/2011 | Melanson et al. |
| 8,081,199 B2 | 12/2011 | Takata et al. |
| 8,093,951 B1 | 1/2012 | Zhang et al. |
| 8,159,297 B2 | 4/2012 | Kumagai |
| 8,164,388 B2 | 4/2012 | Iwamatsu |
| 8,174,313 B2 | 5/2012 | Vice |
| 8,183,917 B2 | 5/2012 | Drogi et al. |
| 8,183,929 B2 | 5/2012 | Grondahl |
| 8,198,941 B2 | 6/2012 | Lesso |
| 8,204,456 B2 | 6/2012 | Xu et al. |
| 8,242,813 B1 | 8/2012 | Wile et al. |
| 8,253,485 B2 | 8/2012 | Clifton |
| 8,253,487 B2 | 8/2012 | Hou et al. |

(56) References Cited

U.S. PATENT DOCUMENTS

| | | |
|---|---|---|
| 8,274,332 B2 | 9/2012 | Cho et al. |
| 8,289,084 B2 | 10/2012 | Morimoto et al. |
| 8,358,113 B2 | 1/2013 | Cheng et al. |
| 8,362,837 B2 | 1/2013 | Koren et al. |
| 8,364,101 B2 | 1/2013 | Shizawa et al. |
| 8,446,135 B2 | 5/2013 | Chen et al. |
| 8,493,141 B2 | 7/2013 | Khlat et al. |
| 8,519,788 B2 | 8/2013 | Khlat |
| 8,541,993 B2 | 9/2013 | Notman et al. |
| 8,542,061 B2 | 9/2013 | Levesque et al. |
| 8,558,616 B2 | 10/2013 | Shizawa et al. |
| 8,571,498 B2 | 10/2013 | Khlat |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 | 1/2014 | Khlat et al. |
| 8,633,766 B2 | 1/2014 | Khlat et al. |
| 8,638,165 B2 | 1/2014 | Shah et al. |
| 8,648,657 B1 | 2/2014 | Rozenblit |
| 8,659,355 B2 | 2/2014 | Henshaw et al. |
| 8,693,676 B2 | 4/2014 | Xiao et al. |
| 8,717,100 B2 | 5/2014 | Reisner et al. |
| 8,718,579 B2 | 5/2014 | Drogi |
| 8,718,582 B2 * | 5/2014 | See et al. .................. 455/127.3 |
| 8,725,218 B2 | 5/2014 | Brown et al. |
| 8,744,382 B2 | 6/2014 | Hou et al. |
| 8,749,307 B2 | 6/2014 | Zhu et al. |
| 8,760,228 B2 | 6/2014 | Khlat |
| 8,782,107 B2 | 7/2014 | Myara et al. |
| 8,792,840 B2 | 7/2014 | Khlat et al. |
| 8,803,605 B2 | 8/2014 | Fowers et al. |
| 8,824,978 B2 | 9/2014 | Briffa et al. |
| 8,829,993 B2 | 9/2014 | Briffa et al. |
| 8,878,606 B2 | 11/2014 | Khlat et al. |
| 8,884,696 B2 | 11/2014 | Langer |
| 8,909,175 B1 | 12/2014 | McCallister |
| 8,942,313 B2 | 1/2015 | Khlat et al. |
| 8,942,651 B2 | 1/2015 | Jones |
| 8,942,652 B2 | 1/2015 | Khlat et al. |
| 8,947,161 B2 | 2/2015 | Khlat et al. |
| 8,947,162 B2 | 2/2015 | Wimpenny et al. |
| 8,952,710 B2 | 2/2015 | Retz et al. |
| 8,957,728 B2 | 2/2015 | Gorisse |
| 8,975,959 B2 | 3/2015 | Khlat |
| 8,981,839 B2 | 3/2015 | Kay et al. |
| 8,981,847 B2 | 3/2015 | Balteanu |
| 8,981,848 B2 | 3/2015 | Kay et al. |
| 8,994,345 B2 | 3/2015 | Wilson |
| 9,019,011 B2 | 4/2015 | Hietala et al. |
| 9,020,451 B2 | 4/2015 | Khlat |
| 9,024,688 B2 | 5/2015 | Kay et al. |
| 9,041,364 B2 | 5/2015 | Khlat |
| 9,041,365 B2 | 5/2015 | Kay et al. |
| 9,075,673 B2 | 7/2015 | Khlat et al. |
| 9,077,405 B2 | 7/2015 | Jones et al. |
| 9,099,961 B2 | 8/2015 | Kay et al. |
| 9,112,452 B1 | 8/2015 | Khlat |
| 2002/0071497 A1 | 6/2002 | Bengtsson et al. |
| 2002/0125869 A1 | 9/2002 | Groom et al. |
| 2002/0176188 A1 | 11/2002 | Ruegg et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0146791 A1 | 8/2003 | Shvarts et al. |
| 2003/0153289 A1 | 8/2003 | Hughes et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0051384 A1 | 3/2004 | Jackson et al. |
| 2004/0124913 A1 | 7/2004 | Midya et al. |
| 2004/0127173 A1 | 7/2004 | Leizerovich |
| 2004/0132424 A1 | 7/2004 | Aytur et al. |
| 2004/0184569 A1 | 9/2004 | Challa et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0079835 A1 | 4/2005 | Takabayashi et al. |
| 2005/0093630 A1 | 5/2005 | Whittaker et al. |
| 2005/0110562 A1 | 5/2005 | Robinson et al. |
| 2005/0122171 A1 | 6/2005 | Miki et al. |
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0184713 A1 | 8/2005 | Xu et al. |
| 2005/0200407 A1 | 9/2005 | Arai et al. |
| 2005/0208907 A1 | 9/2005 | Yamazaki et al. |
| 2005/0258891 A1 | 11/2005 | Ito et al. |
| 2005/0286616 A1 | 12/2005 | Kodavati |
| 2006/0006946 A1 | 1/2006 | Burns et al. |
| 2006/0062324 A1 | 3/2006 | Naito et al. |
| 2006/0097711 A1 | 5/2006 | Brandt |
| 2006/0114069 A1 | 6/2006 | Kojima et al. |
| 2006/0128324 A1 | 6/2006 | Tan et al. |
| 2006/0147062 A1 | 7/2006 | Niwa et al. |
| 2006/0154637 A1 | 7/2006 | Eyries et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2006/0270366 A1 | 11/2006 | Rozenblit et al. |
| 2007/0008757 A1 | 1/2007 | Usui et al. |
| 2007/0008804 A1 | 1/2007 | Lu et al. |
| 2007/0014382 A1 | 1/2007 | Shakeshaft et al. |
| 2007/0024360 A1 | 2/2007 | Markowski |
| 2007/0024365 A1 | 2/2007 | Ramaswamy et al. |
| 2007/0054635 A1 | 3/2007 | Black et al. |
| 2007/0063681 A1 | 3/2007 | Liu |
| 2007/0082622 A1 | 4/2007 | Leinonen et al. |
| 2007/0146076 A1 | 6/2007 | Baba |
| 2007/0159256 A1 | 7/2007 | Ishikawa et al. |
| 2007/0182392 A1 | 8/2007 | Nishida |
| 2007/0183532 A1 | 8/2007 | Matero |
| 2007/0184794 A1 | 8/2007 | Drogi et al. |
| 2007/0249304 A1 | 10/2007 | Snelgrove et al. |
| 2007/0259628 A1 | 11/2007 | Carmel et al. |
| 2007/0290749 A1 | 12/2007 | Woo et al. |
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0157745 A1 | 7/2008 | Nakata |
| 2008/0205095 A1 | 8/2008 | Pinon et al. |
| 2008/0224769 A1 | 9/2008 | Markowski et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0259656 A1 | 10/2008 | Grant |
| 2008/0280577 A1 | 11/2008 | Beukema et al. |
| 2009/0004981 A1 | 1/2009 | Eliezer et al. |
| 2009/0015229 A1 | 1/2009 | Kotikalapoodi |
| 2009/0015299 A1 | 1/2009 | Ryu et al. |
| 2009/0039947 A1 | 2/2009 | Williams |
| 2009/0045872 A1 | 2/2009 | Kenington |
| 2009/0082006 A1 | 3/2009 | Pozsgay et al. |
| 2009/0097591 A1 | 4/2009 | Kim |
| 2009/0140706 A1 | 6/2009 | Taufik et al. |
| 2009/0160548 A1 | 6/2009 | Ishikawa et al. |
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 | 7/2009 | Kazakevich et al. |
| 2009/0191826 A1 | 7/2009 | Takinami et al. |
| 2009/0218995 A1 | 9/2009 | Ahn |

(56) References Cited

U.S. PATENT DOCUMENTS

| | | |
|---|---|---|
| 2009/0230934 A1 | 9/2009 | Hooijschuur et al. |
| 2009/0261908 A1 | 10/2009 | Markowski |
| 2009/0284235 A1 | 11/2009 | Weng et al. |
| 2009/0289720 A1 | 11/2009 | Takinami et al. |
| 2009/0319065 A1 | 12/2009 | Risbo |
| 2009/0326624 A1 | 12/2009 | Melse |
| 2010/0001793 A1 | 1/2010 | Van Zeijl et al. |
| 2010/0002473 A1 | 1/2010 | Williams |
| 2010/0019749 A1 | 1/2010 | Katsuya et al. |
| 2010/0019840 A1 | 1/2010 | Takahashi |
| 2010/0026250 A1 | 2/2010 | Petty |
| 2010/0027301 A1 | 2/2010 | Hoyerby |
| 2010/0045247 A1 | 2/2010 | Blanken et al. |
| 2010/0171553 A1 | 7/2010 | Okubo et al. |
| 2010/0181973 A1 | 7/2010 | Pauritsch et al. |
| 2010/0253309 A1 | 10/2010 | Xi et al. |
| 2010/0266066 A1 | 10/2010 | Takahashi |
| 2010/0289568 A1 | 11/2010 | Eschauzier et al. |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2010/0327825 A1 | 12/2010 | Mehas et al. |
| 2010/0327971 A1 | 12/2010 | Kumagai |
| 2011/0018626 A1 | 1/2011 | Kojima |
| 2011/0058601 A1 | 3/2011 | Kim et al. |
| 2011/0084756 A1 | 4/2011 | Saman et al. |
| 2011/0084760 A1 | 4/2011 | Guo et al. |
| 2011/0109387 A1 | 5/2011 | Lee |
| 2011/0148375 A1 | 6/2011 | Tsuji |
| 2011/0148385 A1 | 6/2011 | North et al. |
| 2011/0193629 A1 | 8/2011 | Hou et al. |
| 2011/0234182 A1 | 9/2011 | Wilson |
| 2011/0235827 A1 | 9/2011 | Lesso et al. |
| 2011/0260706 A1 | 10/2011 | Nishijima |
| 2011/0279180 A1 | 11/2011 | Yamanouchi et al. |
| 2011/0298433 A1 | 12/2011 | Tam |
| 2011/0298539 A1 | 12/2011 | Drogi et al. |
| 2011/0304400 A1 | 12/2011 | Stanley |
| 2012/0025907 A1 | 2/2012 | Koo et al. |
| 2012/0025919 A1 | 2/2012 | Huynh |
| 2012/0032658 A1 | 2/2012 | Casey et al. |
| 2012/0034893 A1 | 2/2012 | Baxter et al. |
| 2012/0049894 A1 | 3/2012 | Berchtold et al. |
| 2012/0049953 A1 | 3/2012 | Khlat |
| 2012/0068767 A1 | 3/2012 | Henshaw et al. |
| 2012/0074916 A1 | 3/2012 | Trochut |
| 2012/0098595 A1 | 4/2012 | Stockert |
| 2012/0119813 A1 | 5/2012 | Khlat et al. |
| 2012/0133299 A1 | 5/2012 | Capodivacca et al. |
| 2012/0139516 A1 | 6/2012 | Tsai et al. |
| 2012/0154035 A1 | 6/2012 | Hongo et al. |
| 2012/0154054 A1 | 6/2012 | Kaczman et al. |
| 2012/0170334 A1 | 7/2012 | Menegoli et al. |
| 2012/0170690 A1 | 7/2012 | Ngo et al. |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0212197 A1 | 8/2012 | Fayed et al. |
| 2012/0236444 A1 | 9/2012 | Srivastava et al. |
| 2012/0244916 A1 | 9/2012 | Brown et al. |
| 2012/0249103 A1 | 10/2012 | Latham, II et al. |
| 2012/0269240 A1 | 10/2012 | Balteanu et al. |
| 2012/0274235 A1 | 11/2012 | Lee et al. |
| 2012/0299647 A1 | 11/2012 | Honjo et al. |
| 2012/0313701 A1 | 12/2012 | Khlat et al. |
| 2013/0034139 A1 | 2/2013 | Khlat et al. |
| 2013/0038305 A1 | 2/2013 | Arno et al. |
| 2013/0094553 A1 | 4/2013 | Paek et al. |
| 2013/0106378 A1 | 5/2013 | Khlat |
| 2013/0107769 A1 | 5/2013 | Khlat et al. |
| 2013/0134956 A1 | 5/2013 | Khlat |
| 2013/0141064 A1 | 6/2013 | Kay et al. |
| 2013/0141068 A1 | 6/2013 | Kay et al. |
| 2013/0141072 A1 | 6/2013 | Khlat et al. |
| 2013/0141169 A1 | 6/2013 | Khlat et al. |
| 2013/0147445 A1 | 6/2013 | Levesque et al. |
| 2013/0154729 A1 | 6/2013 | Folkmann et al. |
| 2013/0169245 A1 | 7/2013 | Kay et al. |
| 2013/0181521 A1 | 7/2013 | Khlat |
| 2013/0214858 A1 | 8/2013 | Tournatory et al. |
| 2013/0229235 A1 | 9/2013 | Ohnishi |
| 2013/0238913 A1 | 9/2013 | Huang et al. |
| 2013/0271221 A1 | 10/2013 | Levesque et al. |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |
| 2014/0028370 A1 | 1/2014 | Wimpenny |
| 2014/0028392 A1 | 1/2014 | Wimpenny |
| 2014/0042999 A1 | 2/2014 | Barth et al. |
| 2014/0049321 A1 | 2/2014 | Gebeyehu et al. |
| 2014/0055197 A1 | 2/2014 | Khlat et al. |
| 2014/0057684 A1 | 2/2014 | Khlat |
| 2014/0062590 A1 | 3/2014 | Khlat et al. |
| 2014/0077787 A1 | 3/2014 | Gorisse et al. |
| 2014/0097895 A1 | 4/2014 | Khlat et al. |
| 2014/0099906 A1 | 4/2014 | Khlat |
| 2014/0099907 A1 | 4/2014 | Chiron |
| 2014/0103995 A1 | 4/2014 | Langer |
| 2014/0111178 A1 | 4/2014 | Khlat et al. |
| 2014/0125408 A1 | 5/2014 | Kay et al. |
| 2014/0139199 A1 | 5/2014 | Khlat et al. |
| 2014/0184335 A1 | 7/2014 | Nobbe et al. |
| 2014/0203868 A1 | 7/2014 | Khlat et al. |
| 2014/0203869 A1 | 7/2014 | Khlat et al. |
| 2014/0225674 A1 | 8/2014 | Folkmann et al. |
| 2014/0266427 A1 | 9/2014 | Chiron |
| 2014/0266428 A1 | 9/2014 | Chiron et al. |
| 2014/0285164 A1 | 9/2014 | Oishi et al. |
| 2014/0306769 A1 | 10/2014 | Khlat et al. |
| 2015/0048891 A1 | 2/2015 | Rozek et al. |
| 2015/0180422 A1 | 6/2015 | Khlat et al. |
| 2015/0234402 A1 | 8/2015 | Kay et al. |

FOREIGN PATENT DOCUMENTS

| | | |
|---|---|---|
| CN | 1518209 A | 8/2004 |
| CN | 1898860 A | 1/2007 |
| CN | 101106357 A | 1/2008 |
| CN | 101201891 A | 6/2008 |
| CN | 101379695 A | 3/2009 |
| CN | 101405671 A | 4/2009 |
| CN | 101416385 A | 4/2009 |
| CN | 101427459 A | 5/2009 |
| CN | 101548476 A | 9/2009 |
| CN | 101626355 A | 1/2010 |
| CN | 101635697 A | 1/2010 |
| CN | 101669280 A | 3/2010 |
| CN | 101867284 A | 10/2010 |
| CN | 201674399 U | 12/2010 |
| EP | 0755121 A2 | 1/1996 |
| EP | 1047188 A2 | 10/2000 |
| EP | 1317105 A1 | 6/2003 |
| EP | 1492227 A1 | 12/2004 |
| EP | 1557955 A1 | 7/2005 |
| EP | 1569330 A1 | 8/2005 |
| EP | 2214304 A1 | 8/2010 |
| EP | 2244366 A1 | 10/2010 |
| EP | 2372904 A1 | 10/2011 |
| EP | 2579456 A1 | 4/2013 |
| GB | 2398648 A | 8/2004 |
| GB | 2462204 A | 2/2010 |
| GB | 2465552 A | 5/2010 |
| GB | 2484475 A | 4/2012 |
| JP | 2010166157 A | 7/2010 |
| TW | 461168 B | 10/2001 |
| WO | 0048306 A1 | 8/2000 |
| WO | 2004002006 A1 | 12/2003 |
| WO | 2004082135 A2 | 9/2004 |
| WO | 2005013084 A2 | 2/2005 |
| WO | 2006021774 A1 | 3/2006 |
| WO | 2006070319 A1 | 7/2006 |
| WO | 2006073208 A1 | 7/2006 |

(56) References Cited

FOREIGN PATENT DOCUMENTS

| WO | 2007107919 A1 | 9/2007 |
|---|---|---|
| WO | 2007149346 A2 | 12/2007 |
| WO | 2012151594 A2 | 11/2012 |
| WO | 2012172544 A1 | 12/2012 |

OTHER PUBLICATIONS

Non-Final Office Action for U.S. Appl. No. 13/550,049, mailed Nov. 25, 2013, 6 pages.
Non-Final Office Action for U.S. Appl. No. 12/836,307, mailed Nov. 5, 2013, 6 pages.
Examination Report for European Patent Application No. 11720630.0, mailed Aug. 16, 2013, 5 pages.
Final Office Action for U.S. Appl. No. 13/297,470, mailed Oct. 25, 2013, 17 pages.
Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.
Yousefzadeh, Vahid et al., "Band Separation and Efficiency Optimization in Linear-Assisted Switching Power Amplifiers," 37th IEEE Power Electronics Specialists Conference, Jun. 18-22, 2006, 7 pages.
International Preliminary Report on Patentability for PCT/US2012/040317, mailed Dec. 12, 2013, 5 pages.
Notice of Allowance for U.S. Appl. No. 13/531,719, mailed Dec. 30, 2013, 7 pages.
Non-Final Office Action for U.S. Appl. No. 14/022,940, mailed Dec. 20, 2013, 5 pages.
International Search Report and Written Opinion for PCT/US2013/052277, mailed Jan. 7, 2014, 14 pages.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASICON), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Notice of Allowance for U.S. Appl. No. 13/363,888, mailed Jul. 18, 2013, 9 pages.
Notice of Allowance for U.S. Appl. No. 13/222,453, mailed Aug. 22, 2013, 8 pages.
Non-Final Office Action for U.S. Appl. No. 13/367,973, mailed Sep. 24, 2013, 8 pages.
Notice of Allowance for U.S. Appl. No. 13/423,649, mailed Aug. 30, 2013, 8 pages.
Notice of Allowance for U.S. Appl. No. 13/316,229, mailed Aug. 29, 2013, 8 pages.
Quayle Action for U.S. Appl. No. 13/531,719, mailed Oct. 10, 2013, 5 pages.
Notice of Allowance for U.S. Appl. No. 13/550,060, mailed Aug. 16, 2013, 8 pages.
Notice of Allowance for U.S. Appl. No. 13/222,484, mailed Aug. 26, 2013, 8 pages.
Notice of Allowance for U.S. Appl. No. 13/602,856, mailed Sep. 24, 2013, 9 pages.
International Preliminary Report on Patentability for PCT/US2012/024124, mailed Aug. 22, 2013, 8 pages.
International Preliminary Report on Patentability for PCT/US2012/023495, mailed Aug. 15, 2013, 10 pages.
Notice of Allowance for U.S. Appl. No. 13/188,024, mailed Jun. 18, 2013, 7 pages.
International Preliminary Report on Patentability for PCT/US2011/054106 mailed Apr. 11, 2013, 8 pages.
International Preliminary Report on Patentability for PCT/US2011/061007 mailed May 30, 2013, 11 pages.
International Preliminary Report on Patentability for PCT/US2011/061009 mailed May 30, 2013, 10 pages.
Non-Final Office Action for U.S. Appl. No. 13/423,649, mailed May 22, 2013, 7 pages.
Advisory Action for U.S. Appl. No. 13/222,484, mailed Jun. 14, 2013, 3 pages.
International Preliminary Report on Patentability for PCT/US2011/064255, mailed Jun. 20, 2013, 7 pages.
Notice of Allowance for U.S. Appl. No. 13/343,840, mailed Jul. 1, 2013, 8 pages.
Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
Cidronali, A. et al., "A 240W Dual-Band 870 and 2140 MHz Envelope Tracking GaN PA Designed by a Probability Distribution Conscious Approach," IEEE MTT-S International Microwave Symposium Digest, Jun. 5-10, 2011, 4 pages.
Dixon, N., "Standardisation Boosts Momentum for Envelope Tracking," Microwave Engineers, Europe, Apr. 20, 2011, 2 pages, http://www.mwee.com/en/standardisation-boosts-momentum-for-envelope-tracking.html?cmp_ids=71&news_ids=222901746.
Hekkala, A. et al., "Adaptive Time Misalignment Compensation in Envelope Tracking Amplifiers," International Symposium on Spread Spectrum Techniques and Applications, Aug. 2008, pp. 761-765.
Kim et al., "High Efficiency and Wideband Envelope Tracking Power Amplifiers with Sweet Spot Tracking," 2010 IEEE Radio Frequency Integrated Circuits Symposium, May 5-7, 2010, pp. 255-258.
Kim, N. et al, "Ripple Feedback Filter Suitable for Analog/Digital Mixed-Mode Audio Amplifier for Improved Efficiency and Stability," Power Electronics Specialists Conference, vol. 1, Jun. 23, 2002, pp. 45-49.
Knutson, P, et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.
Le-Hanh-Phuc et al., "A 32nm Fully Intergrated Reconfigurable Switched-Capacitor DC-DC Convertor Delivering 0.55W/mm^2 at 81% Efficiency," IEEE International Solid State Circuits Conference, Feb. 20-24, 2010, pp. 210-212.
Li et al., "A Highly Efficient SiGe Differential Power Amplifier Using an Envelope-Tracking Technique for 3GPP LTE Applications," IEEE Bipolar/BiCMOS Circuits and Technology Meeting (BCTM), Oct. 4-6, 2010, pp. 121-124.
Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.
Unknown, "Nujira Files 100th Envelope Tracking Patent," CS: Compound Semiconductor, Apr. 11, 2011, 1 page.
Non-final Office Action for U.S. Appl. No. 11/113,873, now U.S. Pat. No. 7,773,691, mailed Feb. 1, 2008, 17 pages.
Final Office Action for U.S. Appl. No. 11/113,873, now U.S. Pat. No. 7,773,691, mailed Jul. 30, 2008, 19 pages.
Non-final Office Action for U.S. Appl. No. 11/113,873, now U.S. Pat. No. 7,773,691, mailed Nov. 26, 2008, 22 pages.
Final Office Action for U.S. Appl. No. 11/113,873, now U.S. Pat. No. 7,773,691, mailed May 4, 2009, 20 pages.
Non-final Office Action for U.S. Appl. No. 11/113,873, now U.S. Pat. No. 7,773,691, mailed Feb. 3, 2010, 21 pages.
Notice of Allowance for U.S. Appl. No. 11/113,873, now U.S. Pat. No. 7,773,691, mailed Jun. 9, 2010, 7 pages.
International Search Report for PCT/US06/12619 mailed May 8, 2007, 2 pages.
Extended European Search Report for application 06740532.4 mailed Dec. 7, 2010, 7 pages.
Non-final Office Action for U.S. Appl. No. 12/112,006 mailed Apr. 5, 2010, 6 pages.
Notice of Allowance for U.S. Appl. No. 12/112,006 mailed Jul. 19, 2010, 6 pages.

(56) References Cited

OTHER PUBLICATIONS

Non-final Office Action for U.S. Appl. No 13/089,917 mailed Nov. 23, 2012, 6 pages.
International Search Report for PCT/US11/033037, mailed Aug. 9, 2011, 10 pages.
International Preliminary Report on Patentability for PCT/US2011/033037 mailed Oct. 23, 2012, 7 pages.
Non-Final Office Action for U.S. Appl. No. 13/188,024, mailed Feb. 5, 2013, 8 pages.
International Search Report for PCT/US2011/044857, mailed Oct. 24, 2011, 10 pages.
International Preliminary Report on Patentability for PCT/US2011/044857 mailed Mar. 7, 2013, 6 pages.
Non-final Office Action for U.S. Appl. No. 13/218,400 mailed Nov. 8, 2012, 7 pages.
Notice of Allowance for U.S. Appl. No. 13/218,400 mailed Apr. 11, 2013, 7 pages.
International Search Report for PCT/US11/49243, mailed Dec. 22, 2011, 9 pages.
International Preliminary Report on Patentability for PCT/US11/49243 mailed Nov. 13, 2012, 33 pages.
International Search Report for PCT/US2011/054106 mailed Feb. 9, 2012, 11 pages.
International Search Report for PCT/US2011/061007 mailed Aug. 16, 2012, 16 pages.
Non-Final Office Action for U.S. Appl. No. 13/297,470 mailed May 8, 2013, 15 pages.
International Search Report for PCT/US2011/061009 mailed Feb. 8, 2012, 14 pages.
International Search Report for PCT/US2012/023495 mailed May 7, 2012, 13 pages.
Non-final Office Action for U.S. Appl. No. 13/222,453 mailed Dec. 6, 2012, 13 pages.
Notice of Allowance for U.S. Appl. No. 13/222,453 mailed Feb. 21, 2013, 7 pages.
Invitation to Pay Additional Fees and Where Applicable Protest Fee for PCT/US2012/024124 mailed Jun. 1, 2012, 7 pages.
International Search Report for PCT/US2012/024124 mailed Aug. 24, 2012, 14 pages.
Notice of Allowance for U.S. Appl. No. 13/316,229 mailed Nov. 14, 2012, 9 pages.
International Search Report for PCT/US2011/064255 mailed Apr. 3, 2012, 12 pages.
International Search Report for PCT/US2012/40317 mailed Sep. 7, 2012, 7 pages.
International Search Report for PCT/US2012/046887 mailed Dec. 21, 2012, 12 pages.
Non-final Office Action for U.S. Appl. No. 13/222,484 mailed Nov. 8, 2012, 9 pages.
Final Office Action for U.S. Appl. No. 13/222,484 mailed Apr. 10, 2013, 10 pages.
International Search Report and Written Opinion for PCT/US2012/053654 mailed Feb. 15, 2013, 11 pages.
International Search Report and Written Opinion for PCT/US2012/062070, mailed Jan. 21, 2013, 12 pages.
International Search Report and Written Opinion for PCT/US2012/067230 mailed Feb. 21, 2013, 10 pages.
Notice of Allowance for U.S. Appl. No. 13/297,490, mailed Feb. 27, 2014, 7 pages.
Non-Final Office Action for U.S. Appl. No. 13/297,470, mailed Feb. 20, 2014, 16 pages.
Notice of Allowance for U.S. Appl. No. 13/550,049, mailed Mar. 6, 2014, 5 pages.
International Preliminary Report on Patentability for PCT/US2012/046887, mailed Jan. 30, 2014, 8 pages.
International Preliminary Report on Patentability for PCT/US2012/053654, mailed Mar. 13, 2014, 7 pages.
Non-Final Office Action for U.S. Appl. No. 13/661,552, mailed Feb. 21, 2014, 5 pages.
International Search Report and Written Opinion for PCT/US2013/065403, mailed Feb. 5, 2014, 11 pages.
Non-Final Office Action for U.S. Appl. No. 12/836,307, mailed Sep. 25, 2014, 5 pages.
Advisory Action for U.S. Appl. No. 13/297,470, mailed Sep. 19, 2014, 3 pages.
Non-Final Office Action for U.S. Appl. No. 13/297,470, mailed Oct. 20, 2014, 22 pages.
Notice of Allowance for U.S. Appl. No. 13/367,973, mailed Sep. 15, 2014, 7 pages.
Notice of Allowance for U.S. Appl. No. 13/647,815, mailed Sep. 19, 2014, 6 pages.
Non-Final Office Action for U.S. Appl. No. 13/661,227, mailed Sep. 29, 2014, 24 pages.
Notice of Allowance for U.S. Appl. No. 13/684,826, mailed Sep. 8, 2014, 6 pages.
Non-Final Office Action for U.S. Appl. No. 13/714,600, mailed Oct. 15, 2014, 13 pages.
Notice of Allowance for U.S. Appl. No. 13/914,888, mailed Oct. 17, 2014, 10 pages.
Non-Final Office Action for U.S. Appl. No. 13/747,725, mailed Oct. 7, 2014, 6 pages.
Extended European Search Report for European Patent Application No. 12794149.0, issued Oct. 29, 2014, 6 pages.
International Search Report and Written Opinion for PCT/US2014/012927, mailed Sep. 30, 2014, 11 pages.
International Search Report and Written Opinion for PCT/US2014/028178, mailed Sep. 30, 2014, 17 pages.
European Search Report for Patent Application No. 14162682.0, issued Aug. 27, 2014, 7 pages.
Invitation to Pay Additional Fees and Partial International Search Report for PCT/US2014/028178, mailed Jul. 24, 2014, 7 pages.
Notice of Allowance for U.S. Appl. No. 14/072,140, mailed Aug. 27, 2014, 8 pages.
Non-Final Office Action for U.S. Appl. No. 14/072,225, mailed Aug. 15, 2014, 4 pages.
Notice of Allowance for U.S. Appl. No. 13/548,283, mailed Sep. 3, 2014, 7 pages.
Notice of Allowance for U.S. Appl. No. 13/690,187, mailed Sep. 3, 2014, 9 pages.
Non-Final Office Action for U.S. Appl. No. 13/782,142, mailed Sep. 4, 2014, 6 pages.
European Search Report for European Patent Application No. 14190851.7, issued Mar. 5, 2015, 6 pages.
Notice of Allowance for U.S. Appl. No. 14/072,140, mailed Dec. 2, 2014, 8 pages.
Notice of Allowance for U.S. Appl. No. 13/486,012, mailed Nov. 21, 2014, 8 pages.
Notice of Allowance for U.S. Appl. No. 13/690,187, mailed Dec. 19, 2014, 8 pages.
Notice of Allowance for U.S. Appl. No. 13/747,694, mailed Dec. 22, 2014, 9 pages.
Notice of Allowance for U.S. Appl. No. 13/951,976, mailed Dec. 26, 2014, 9 pages.
Non-Final Office Action for U.S. Appl. No. 13/747,749, mailed Nov. 12, 2014, 32 pages.
First Office Action for Chinese Patent Application No. 201280026559.0, issued Nov. 3, 2014, 14 pages (with English translation).
Notice of Allowance for U.S. Appl. No. 13/948,291, mailed Feb. 11, 2015, 7 pages.
Notice of Allowance for U.S. Appl. No. 14/022,858, mailed Feb. 17, 2015, 7 pages.
Notice of Allowance for U.S. Appl. No. 14/072,225, mailed Jan. 22, 2015, 7 pages.
Final Office Action for U.S. Appl. No. 13/661,227, mailed Feb. 6, 2015, 24 pages.
Non-Final Office Action for U.S. Appl. No. 14/048,109, mailed Feb. 18, 2015, 8 pages.
Notice of Allowance for U.S. Appl. No. 13/747,725, mailed Feb. 2, 2015, 10 pages.

(56) References Cited

OTHER PUBLICATIONS

First Office Action for Chinese Patent Application No. 201180030273.5, issued Dec. 3, 2014, 15 pages (with English translation).
International Preliminary Report on Patentability for PCT/US2013/052277, mailed Feb. 5, 2015, 9 pages.
Notice of Allowance for U.S. Appl. No. 12/836,307, mailed Mar. 2, 2015, 6 pages.
Notice of Allowance for U.S. Appl. No. 13/297,470, mailed Feb. 25, 2015, 15 pages.
Corrected Notice of Allowance for U.S. Appl. No. 13/297,470, mailed Apr. 6, 2015, 11 pages.
Non-Final Office Action for U.S. Appl. No. 14/122,852, mailed Feb. 27, 2015, 5 pages.
Final Office Action for U.S. Appl. No. 13/714,600, mailed Mar. 10, 2015, 14 pages.
Non-Final Office Action for U.S. Appl. No. 14/056,292, mailed Mar. 6, 2015, 8 pages.
Final Office Action for U.S. Appl. No. 13/747,749, mailed Mar. 20, 2015, 35 pages.
Non-Final Office Action for U.S. Appl. No. 14/072,120, mailed Apr. 14, 2015, 8 pages.
Yun, Hu et al., "Study of envelope tracking power amplifier design," Journal of Circuits and Systems, vol. 15, No. 6, Dec. 2010, pp. 6-10.
Notice of Allowance for U.S. Appl. No. 13/948,291, mailed Jul. 17, 2015, 8 pages.
Second Office Action for Chinese Patent Application No. 201180030273.5, issued Aug. 14, 2015, 8 pages.
European Examination Report for European Patent Application No. 14162682.0, mailed May 22, 2015, 5 pages.
Corrected Notice of Allowance for U.S. Appl. No. 13/297,470, mailed Jun. 5, 2015, 11 pages.
Notice of Allowance for U.S. Appl. No. 14/072,140, mailed Aug. 20, 2015, 6 pages.
Non-Final Office Action for U.S. Appl. No. 14/072,225, mailed Aug. 18, 2015, 4 pages.
Advisory Action for U.S. Appl. No. 13/661,227, mailed May 12, 2015, 3 pages.
Non-Final Office Action for U.S. Appl. No. 13/661,227, mailed Jul. 27, 2015, 25 pages.
Advisory Action for U.S. Appl. No. 13/714,600, mailed May 26, 2015, 3 pages.
Non-Final Office Action for U.S. Appl. No. 13/714,600, mailed Jul. 17, 2015, 14 pages.
Notice of Allowance for U.S. Appl. No. 14/212,154, mailed Jul. 17, 2015, 8 pages.
Notice of Allowance for U.S. Appl. No. 14/212,199, mailed Jul. 20, 2015, 8 pages.
Notice of Allowance for U.S. Appl. No. 13/747,725, mailed May 13, 2015, 9 pages.
Notice of Allowance for U.S. Appl. No. 13/747,725, mailed Sep. 1, 2015, 9 pages.
Notice of Allowance for U.S. Appl. No. 13/747,749, mailed Jun. 4, 2015, 8 pages.
Notice of Allowance for U.S. Appl. No. 13/747,749, mailed Oct. 2, 2015, 8 pages.
Notice of Allowance for U.S. Appl. No. 14/072,120, mailed Jul. 30, 2015, 7 pages.
Non-Final Office Action for U.S. Appl. No. 13/552,768, mailed Apr. 20, 2015, 12 pages.
Notice of Allowance for U.S. Appl. No. 13/552,768, mailed Sep. 22, 2015, 9 pages.
Non-Final Office Action for U.S. Appl. No. 13/689,922, mailed Apr. 20, 2015, 19 pages.
Final Office Action for U.S. Appl. No. 13/689,922, mailed Oct. 6, 2015, 20 pages.
Non-Final Office Action for U.S. Appl. No. 13/727,911, mailed Apr. 20, 2015, 10 pages.
Notice of Allowance for U.S. Appl. No. 13/727,911, mailed Sep. 14, 2015, 8 pages.
Notice of Allowance for U.S. Appl. No. 14/027,416, mailed Aug. 11, 2015, 9 pages.
Non-Final Office Action for U.S. Appl. No. 14/163,229, mailed Apr. 23, 2015, 9 pages.
Non-Final Office Action for U.S. Appl. No. 14/163,256, mailed Apr. 23, 2015, 9 pages.
Notice of Allowance for U.S. Appl. No. 14/176,611, mailed Apr. 27, 2015, 7 pages.
International Preliminary Report on Patentability for PCT/US2013/065403, mailed Apr. 30, 2015, 8 pages.
Non-Final Office Action for U.S. Appl. No. 13/689,940, mailed May 14, 2015, 7 pages.
Notice of Allowance for U.S. Appl. No. 13/689,940, mailed Aug. 3, 2015, 6 pages.
Notice of Allowance for U.S. Appl. No. 13/689,940, mailed Sep. 16, 2015, 7 pages.
Non-Final Office Action for U.S. Appl. No. 14/101,770, mailed Sep. 21, 2015, 5 pages.
Notice of Allowance for U.S. Appl. No. 13/661,164, mailed Jun. 3, 2015, 6 pages.
Non-Final Office Action for U.S. Appl. No. 14/082,629, mailed Jun. 18, 2015, 15 pages.
Non-Final Office Action for U.S. Appl. No. 14/702,192, mailed Oct. 7, 2015, 7 pages.
First Office Action for Chinese Patent Application No. 201280052694.2, issued Mar. 24, 2015, 35 pages.
First Office Action and Search Report for Chinese Patent Application No. 201280007941.7, issued May 13, 2015, 13 pages.
International Preliminary Report on Patentability for PCT/US2014/012927, mailed Aug. 6, 2015, 9 pages.
First Office Action and Search Report for Chinese Patent Application No. 201210596632.X, mailed Jun. 25, 2015, 16 pages.
International Preliminary Report on Patentability for PCT/US2014/028089, mailed Sep. 24, 2015, 8 pages.
International Preliminary Report on Patentability for PCT/US2014/028178, mailed Sep. 24, 2015, 11 pages.
Notice of Allowance for U.S. Appl. No. 13/661,164, mailed Oct. 21, 2015, 7 pages.
Non-Final Office Action for U.S. Appl. No. 14/254,215, mailed Oct. 15, 2015, 5 pages.
First Office Action for Chinese Patent Application No. 201180067293.X, mailed Aug. 6, 2015, 13 pages.
Notice of Allowance for U.S. Appl. No. 14/072,225, mailed Feb. 3, 2016, 7 pages.
Advisory Action for U.S. Appl. No. 14/082,629, mailed Jan. 22, 2016, 3 pages.
Non-Final Office Action for U.S. Appl. No. 13/876,518, mailed Jan. 20, 2016, 16 pages.
Notice of Allowance for U.S. Appl. No. 14/163,256, mailed Feb. 10, 2016, 8 pages.
Final Office Action for U.S. Appl. No. 13/661,227, mailed Feb. 9, 2016, 28 pages.
Author Unknown, "Automatically," Definition, Dictionary.com Unabridged, 2015, pp. 1-6, http://dictionary.reference.com/browse/automatically.
Non-Final Office Action for U.S. Appl. No. 14/458,341, mailed Nov. 12, 2015, 5 pages.
Final Office Action for U.S. Appl. No. 13/714,600, mailed Dec. 24, 2015, 15 pages.
Notice of Allowance for U.S. Appl. No. 13/747,725, mailed Oct. 28, 2015, 9 pages.
Advisory Action for U.S. Appl. No. 13/689,922, mailed Dec. 18, 2015, 3 pages.
Notice of Allowance for U.S. Appl. No. 13/727,911, mailed Nov. 10, 2015, 8 pages.
Notice of Allowance for U.S. Appl. No. 14/163,229, mailed Nov. 5, 2015, 8 pages.
Final Office Action for U.S. Appl. No. 14/163,256, mailed Nov. 2, 2015, 10 pages.
Corrected Notice of Allowability for U.S. Appl. No. 13/689,940, mailed Nov. 17, 2015, 4 pages.
Final Office Action for U.S. Appl. No. 14/082,629, mailed Nov. 4, 2015, 17 pages.

(56) References Cited

OTHER PUBLICATIONS

First Office Action for Chinese Patent Application No. 201280042523.1, issued Dec. 4, 2015, 12 pages.
Notice of Allowance and Examiner Initiated Interview Summary for U.S. Appl. No. 13/661,227, mailed May 13, 2016, 10 pages.
Non-Final Office Action for U.S. Appl. No. 13/714,600, mailed May 4, 2016, 14 pages.
Final Office Action for U.S. Appl. No. 13/876,518, mailed Jun. 2, 2016, 14 pages.
Notice of Allowance for U.S. Appl. No. 14/458,341, mailed Feb. 18, 2016, 6 pages.
Advisory Action for U.S. Appl. No. 13/714,600, mailed Mar. 14, 2016, 3 pages.
Notice of Allowance for U.S. Appl. No. 13/689,922, mailed Mar. 18, 2016, 9 pages.
Notice of Allowance for U.S. Appl. No. 14/101,770, mailed Apr. 11, 2016, 6 pages.
Notice of Allowance for U.S. Appl. No. 14/151,167, mailed Mar. 4, 2016, 7 pages.
Non-Final Office Action for U.S. Appl. No. 14/082,629, mailed Mar. 16, 2016, 23 pages.
Notice of Allowance for U.S. Appl. No. 14/702,192, mailed Feb. 22, 2016, 8 pages.
Notice of Allowance for U.S. Appl. No. 14/254,215, mailed Feb. 18, 2016, 7 pages.
First Office Action for Chinese Patent Application No. 201280052739.6, mailed Mar. 3, 2016, 31 pages.
Communication under Rule 164(2)(a) EPC for European Patent Application No. 12725911.7, mailed Feb. 17, 2016, 8 pages.
Wang, Feipeng et al., An Improved Power-Added Efficiency 19-dBm Hybrid Envelope Elimination and Restoration Power Amplifier for 802.11g WLAN Applications, IEEE Transactions on Microwave Theory and Techniques, vol. 54, No. 12, Dec. 2006, pp. 4086-4099.
Examination Report for European Patent Application No. 14190851.7, mailed May 2, 2016, 5 pages.
Combined Search and Examination Report for European Patent Application No. 12725911.7, mailed Jun. 15, 2016, 14 pages.
Notice of Allowance for U.S. Appl. No. 12/836,307 mailed May 5, 2014, 6 pages.
Notice of Allowance for U.S. Appl. No. 14/022,858 mailed May 27, 2014, 6 pages.
Non-Final Office Action for U.S. Appl. No. 13/367,973 mailed Apr. 25, 2014, 5 pages.
Non-Final Office Action for U.S. Appl. No. 13/647,815 mailed May 2, 2014, 6 pages.
Non-Final Office Action for U.S. Appl. No. 13/692,084 mailed Apr. 10, 2014, 6 pages.
Non-Final Office Action for U.S. Appl. No. 13/684,826 mailed Apr. 3, 2014, 5 pages.
Notice of Allowance for U.S. Appl. No. 14/022,940, mailed Jun. 10, 2014, 7 pages.
Non-Final Office Action for U.S. Appl. No. 13/714,600 mailed May 9, 2014, 14 pages.
Non-Final Office Action for U.S. Appl. No. 13/951,976 mailed Apr. 4, 2014, 7 pages.
Invitation pursuant to Article 94(3) and Rule 71(1) EPC for European Patent Application No. 11720630.0 issued Mar. 18, 2014, 4 pages.
International Preliminary Report on Patentability for PCT/US2012/062070 mailed May 8, 2014, 8 pages.
International Search Report and Written Opinion for PCT/US2012/062110 issued Apr. 8, 2014, 12 pages.
International Preliminary Report on Patentability for PCT/US2012/062110 mailed May 8, 2014, 9 pages.
Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 1, 2012, pp. 1185-1198.
Hoversten, John, et al., "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.
Non-Final Office Action for U.S. Appl. No. 13/486,012, mailed Jul. 28, 2014, 7 pages.
Notice of Allowance for U.S. Appl. No. 13/661,552, mailed Jun. 13, 2014, 5 pages.
Notice of Allowance for U.S. Appl. No. 13/692,084, mailed Jul. 23, 2014, 7 pages.
International Preliminary Report on Patentability and Written Opinion for PCT/US2012/067230, mailed Jun. 12, 2014, 7 pages.
Notice of Allowance for U.S. Appl. No. 13/684,826, mailed Jul. 18, 2014, 7 pages.
International Search Report and Written Opinion for PCT/US2014/028089, mailed Jul. 17, 2014, 10 pages.
Notice of Allowance for U.S. Appl. No. 14/638,374, mailed Aug. 30, 2016, 7 pages.
Final Office Action for U.S. Appl. No. 13/714,600, mailed Oct. 5, 2016, 15 pages.
Final Office Action for U.S. Appl. No. 14/082,629, mailed Sep. 8, 2016, 13 pages.
Advisory Action for U.S. Appl. No. 13/876,518, mailed Aug. 15, 2016, 3 pages.
Non-Final Office Action and Examiner Initiated Interview Summary for U.S. Appl. No. 13/876,518, mailed Sep. 22, 2016, 18 pages.

* cited by examiner

MULTIMODE RF AMPLIFIER SYSTEM

RELATED APPLICATIONS

The present application claims priority to U.S. Provisional Patent Application Ser. No. 61/564,967, filed on Nov. 30, 2011, entitled "UCBUCK DCDC INTEGRATED IN 2G-TXM," which is incorporated herein by reference in its entirety.

The present application incorporates by reference the international patent application PCT/US12/36858 in its entirety.

FIELD OF THE DISCLOSURE

This disclosure relates generally to multimode radio frequency (RF) power amplification devices and methods of operating the same.

BACKGROUND

Traditional radio frequency (RF) front-end modules generally use parallel RF amplifiers. Each RF amplifier amplifies an RF signal formatted in accordance with an RF communication standard or a set of RF communication standards. For example, multimode RF front-end modules may include multiple parallel RF amplifiers to amplify RF signals formatted in accordance with 2G Global System for Mobile Communications (GSM) standards, 3G standards, 4G Long Term Evolution (LTE) standards, and the like. Each of these standards may have various specifications at different frequency bands. For instance, the 2G GSM standard includes a Digital Communication System (DCS) specification; a Personal Communications Service (PCS) specification; a GSM-850 specification; a GSM-900 specification; Enhanced Data Rates for GSM Evolution (EDGE) specifications, such as an EDGE-850 specification, an EDGE-950 specification, an EDGE-1800 specification, or an EDGE-1900 specification; a General Packet Radio Service specification; and/or the like. The 3G standard may include Wideband Code Division Multiple Access (W-CDMA) specifications, Time Division Synchronous Code Division Multiple Access (TD-SCDMA) specifications, a High Speed Packet Access (HSPA) specification, and/or the like. The 4G LTE standard may include 4G LTE specifications such as a Multiple-Input and Multiple-Output (MIMO) specification, and/or the like. These RF communication standards and associated specifications may have different spectral, output power, frequency band, and power management requirements.

There is an ever-increasing demand for RF front-end modules capable of handling as many RF communication standards and specifications as possible. As such, RF front-end modules use multiple parallel RF amplifiers, because generally a single RF amplifier architecture is not capable of providing amplification in accordance with the multitude of RF communication standards and specifications. Unfortunately, the power support circuitry needed to support all of these parallel RF amplifiers can be spatially inefficient and therefore expensive. For example, RF amplification architectures often employ duplicate power control components to control the various parallel RF amplifiers. In addition, some types of RF amplifiers receive supply voltages from RF switching converters. While RF switching converters are power efficient, they can also be very noisy. As a result, power support circuitry is often segregated from the RF amplifiers on a separate die.

What is needed are RF amplifier architectures with more spatially efficient power support circuitry.

SUMMARY

Embodiments disclosed in the detailed description include electronic devices having a multimode radio frequency (RF) power amplifier system. The multimode RF amplifier system may support one or more RF communication standards. Various embodiments of multimode RF amplifier systems, devices, and techniques are disclosed.

In one embodiment, a first RF amplifier includes an RF amplifier circuit and an auxiliary circuit. The auxiliary circuit may provide a service or a utility to a second RF amplifier. The first RF amplifier may support a first RF communication standard. The second RF amplifier may support a second RF communication standard. For example, the auxiliary circuit may provide the service or the utility only when the first RF amplifier is not transmitting, or is only transmitting to the second RF amplifier. As another example, the auxiliary circuit may generate a supply voltage to power the second RF amplifier. As another example, the auxiliary circuit may provide a service or a utility to both the first RF amplifier and the second RF amplifier.

As another example, a multimode RF amplifier system may include a first RF amplifier. The first RF amplifier may be packaged in a first electronic package. The first RF amplifier may generate a first RF output signal to support a data transmission based on a first RF communication standard or a data transmission in a first band of frequencies of a communication system. The communication system may include a wireless communication network. The first RF amplifier may include a first RF amplifier circuit and an auxiliary circuit. The auxiliary circuit may include various embodiments of circuitry to provide a service or a function to the first RF amplifier circuit and to one or more other RF amplifiers not in the first electronic package. The auxiliary circuit may provide the service or the utility to the other RF amplifiers while the first RF amplifier is not generating the first RF output signal for transmission over a band of operation in a communication network. As an example, the auxiliary circuit may only provide the service or the utility to a second RF amplifier that is in a second electronic package, and may or may not provide the service or the utility to the first RF amplifier. For example, the auxiliary circuit may generate a supply voltage with a switching circuit and provide the supply voltage to the second RF amplifier while the first RF amplifier is not generating the first RF output signal.

In some embodiments, the multimode RF amplifier system may include a second RF amplifier packaged in a second electronic package. The second RF amplifier may generate a second RF output signal to support a data transmission based on a second RF communication standard or a data transmission in a second band of frequencies of the communication system. In one embodiment, the first RF amplifier may amplify an RF signal from a 2G Global System for Mobile Communications (GSM) mobile communications network. Thus, the RF signal may be formatted in accordance with a 2G GSM standard, including one or more RF communication specifications provided within the 2G GSM standard. The second RF amplifier may amplify an RF signal from a 3G mobile communication network and/or a 4G Long Term Evolution (LTE) mobile communication network. Thus, the RF signal may be formatted in accordance with a 3G standard or a 4G LTE standard, including one or 3G standard and/or the 4G LTE standard. As a further example, the first RF amplifier may support data transmission in a 900 MHz band of a 2G GSM mobile communications network. The second RF amplifier may support data transmission in a 1900 MHz band of a 2G GSM mobile communications network. Alternatively, the first RF amplifier may support a first operational mode of an RF communication standard, while the second RF amplifier may support a second operational mode of the same RF communication standard.

In some embodiments, the auxiliary circuit may provide a service or a utility to a second RF amplifier that includes a second RF amplifier circuit, and to a third RF amplifier that includes a third RF amplifier circuit. In other embodiments, the auxiliary circuit may provide the service or the utility only when the first RF amplifier is not transmitting. In addition, in some embodiments, the auxiliary circuit may provide the service or the utility to only one of the first or second amplifiers at a time. For example, the auxiliary circuit may generate a supply voltage for the second RF amplifier circuit. However, the auxiliary circuit may not provide the supply voltage to the third RF amplifier circuit at the same time. Alternatively, in other embodiments, the auxiliary circuit may simultaneously provide a service or a utility to both the second RF amplifier circuit and the third RF amplifier circuit while the first RF amplifier circuit is disabled.

In this regard, one embodiment of the multimode RF amplifier system may include a first RF amplifier configured to generate a first RF output signal. The first RF amplifier may further include an auxiliary circuit configured to provide a utility to a second RF amplifier that is not used by the first RF amplifier to generate the first RF output signal. In some example embodiments, the utility provided by the auxiliary circuit may enable the second RF amplifier to generate a second RF output signal. In some cases, the first RF amplifier may disable generation of the first RF output signal while the auxiliary circuit enables the second RF amplifier to generate the second RF output signal. As an example utility provided by the auxiliary circuit to the second RF amplifier, the auxiliary circuit may be configured to generate a supply voltage. The supply voltage may be a supply voltage generated by a switching circuit.

In some embodiments, the auxiliary circuit may include control circuitry including a control signal output, and the control circuitry may be configured to govern the operation of the second RF amplifier as a function of one of a parameter, a command, a signal, and/or a combination thereof received from a master device. As an example, the master device may be a controller, a processor, a digital modem, or digital transceiver of an electronic device.

In another embodiment, an electronic device may include an electronic module board. The electronic module board may include a first electronic package and a second electronic package. The first electronic package may include a first RF amplifier configured to generate a first modulated RF output signal based on a first RF communication standard. The first RF amplifier may further include a first RF amplifier circuit, a control bus interface, an auxiliary circuit, and an auxiliary signal interface. The control interface may communicate with an internal or external master device. In some embodiments, the master device and an RF switching converter are configured to generate a supply voltage when the first RF amplifier circuit is not used. The electronic module board may also include a control bus interface configured to interface with a controller and provide control signals to a second RF amplifier. The control bus interface may include a mobile industry processor interface (MIPI) RF front-end (RFFE) control interface. The second electronic package of the electronic device may include the second RF amplifier. A second RF amplifier circuit may include a power supply input configured to receive the supply voltage generated by the RF switching converter. The supply voltage is used by the second RF amplifier to generate a second modulated RF output signal based on the second RF communication standard.

Those skilled in the art will recognize improvements and modifications to the preferred embodiments of the present disclosure. All such improvements and modifications are considered within the scope of the concepts disclosed herein and the claims that follow.

DETAILED DESCRIPTION

Figure 1:
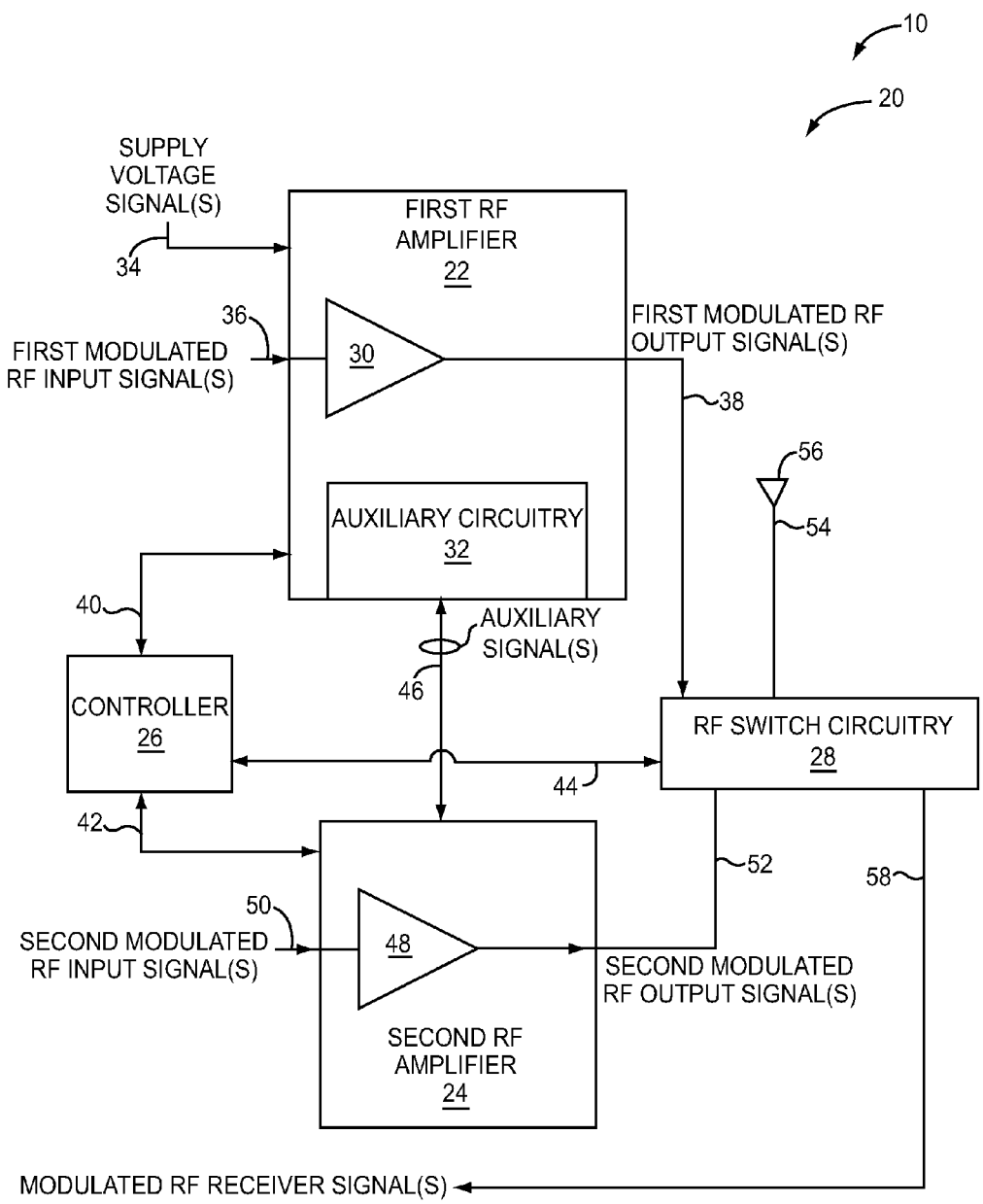
FIG. 1 illustrates an embodiment of a communication device or mobile terminal that includes an example of a multimode radio frequency (RF) power amplifier system having first RF amplifier, second RF amplifier, and RF switch circuitry.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The detailed description describes various embodiments of an electronic device that includes a multimode radio frequency (RF) amplifier system. A multimode RF amplifier system and techniques to provide a multimode RF amplifier system are disclosed herein. In one embodiment, the multimode RF amplifier system may include a first RF amplifier having a first RF amplifier circuit and an auxiliary circuit configured to provide a service or a utility to a second RF amplifier. The first RF amplifier circuit may support a first RF communication standard. The multimode RF amplifier system may also include a second RF amplifier having a second RF amplifier circuit. The second RF amplifier circuit may support a second RF communication standard. In some embodiments, the service or the utility may be provided only when the first RF amplifier is not transmitting or the first RF amplifier circuit is disabled. For example, the auxiliary circuit may generate a supply voltage for the second RF amplifier circuit. In other embodiments, the auxiliary circuit may provide the service or the utility to both the first RF amplifier and second RF amplifier.

Various embodiments of multimode RF amplifier systems and techniques are disclosed. In one embodiment, a multimode RF amplifier system may include a first RF amplifier and a second RF amplifier. A first electronic package may include the first RF amplifier, which may have a first RF amplifier circuit and an auxiliary circuit. A second electronic package may include the second RF amplifier, which may have a second RF amplifier circuit. The first RF amplifier circuit may support a first RF communication standard. The second RF amplifier circuit may support a second RF communication standard. Alternatively, the first RF amplifier circuit may support a first operational mode of an RF communication standard, while the second RF amplifier circuit may support a second operational mode of the same RF communication standard.

In some embodiments, the auxiliary circuit may provide a service or a utility to the second RF amplifier or the second RF amplifier circuit. In some embodiments, the auxiliary circuit may provide the service or the utility only when the first RF amplifier is not transmitting. For example, the auxiliary circuit may generate a supply voltage for the second RF amplifier circuit while a transmit enable state of the first RF amplifier circuit is set to off. However, the auxiliary circuit may not provide the same supply voltage to the first RF amplifier circuit while the transmit enable state of the first RF amplifier circuit is set to on. In other embodiments, the auxiliary circuit may provide the service or the utility to both the first RF amplifier and the second RF amplifier.

In this regard, one embodiment of the first RF amplifier may include a first RF amplifier circuit configured to generate a first RF output signal. The first RF amplifier may further include an auxiliary circuit configured to provide a utility to a second RF amplifier that is not used by the first RF amplifier to generate the first RF output signal. In some embodiments, the utility provided by the auxiliary circuit may enable the second RF amplifier to generate a second RF output signal. In some cases, the first RF amplifier may disable generation of the first RF output signal while the auxiliary circuit enables the second RF amplifier to generate the second RF output signal. As an example, the auxiliary circuit may disable generation of the first RF output signal while the second RF amplifier generates the second RF output signal. As an example of the utility provided by the auxiliary circuit to the second RF amplifier, the auxiliary circuit may generate a supply voltage and provide the supply voltage to the second RF amplifier circuit. For instance, the supply voltage may be a supply voltage generated by a switching circuit.

In some embodiments, the auxiliary circuit may include control circuitry. The control circuitry may include a control interface configured to receive control signals. As an example, the control circuitry may include a control bus interface configured to receive control information for the second RF amplifier. The control circuitry may provide or receive control signals from the second RF amplifier. For instance, the control circuitry may receive control signals from the second RF amplifier. The control circuitry may provide the control signals from the second RF amplifier to a controller via the control interface. As an example, the control circuitry may provide information contained in the control signals to the controller via a control bus.

As a further example, the control circuitry may include a control signal interface configured to provide or receive control signals for various circuits. As an example, the control circuitry may govern the operation of the second RF amplifier as a function of one of a parameter, a command, a signal, and/or a combination thereof received from a master device. A master device may be a controller, a processor, a digital modem, a digital transceiver, and/or the like.

In another embodiment, an electronic device may include an electronic module board having a first RF amplifier. The first RF amplifier has a first RF amplifier circuit configured to generate a first modulated RF output signal based on a first RF communication standard, and an RF switching converter configured to generate a supply voltage while the first RF amplifier circuit is unused. The electronic device may further include a first electronic package. At least a portion of the electronic module board may mount to the first electronic package. The electronic module board may also include a control bus interface configured to interface with a controller and a control interface configured to provide control signals to a second RF amplifier. The control bus interface may include a mobile industry processor interface (MIPI) RF front-end (RFFE) control interface. The electronic device may include a second electronic package that includes the second RF amplifier having a second RF amplifier circuit. The second RF amplifier circuit may include a power supply input configured to receive the supply voltage generated by the RF switching converter. The second RF amplifier may generate a second modulated RF output signal based on a second RF communication standard.

In some embodiments, an auxiliary circuit of the first RF amplifier may be configured to provide a utility that is not used by the first RF amplifier but rather is used by a second RF amplifier. As a non-limiting example, the utility may include generating or providing a current, a voltage, a command, a command interface, a microprocessor interface, a control interface, a measurement means or circuit, a supply voltage, a switch interface, and/or some combination thereof. In some embodiments, the first RF amplifier may include an auxiliary circuit configured to provide a service or a utility to the second RF amplifier, wherein the first RF amplifier is disabled while providing the service or the utility to the second RF amplifier. In other embodiments, the first RF amplifier may include control circuitry configured to control both the first RF amplifier and the second RF amplifier. The control circuitry may configure the first RF amplifier to generate a first RF output signal only when the second RF amplifier is disabled or a transmit enable state of the second RF amplifier is set to off. The control circuitry may configure the auxiliary circuit to support generation of a second RF output signal by the second RF amplifier only when the transmit enable state of the first RF amplifier is set to off.

As another example, another embodiment of a multistandard RF amplifier system may include a first RF amplifier in a first package and a second RF amplifier in a second package. The first RF amplifier may include a first RF input configured to receive a first modulated RF input signal and a first RF output configured to generate a first RF output signal as a function of the first modulated RF input signal. The second RF amplifier may include a second RF input configured to receive a second modulated RF input signal and a second RF output configured to generate a second RF output signal as a function of the second modulated RF input signal.

In some embodiments, the first RF amplifier may be combined with an auxiliary circuit. The auxiliary circuit may include an auxiliary signals interface configured to provide or receive auxiliary signals. The auxiliary circuit may provide a service or a utility to the second RF amplifier. For example, the auxiliary circuit may include a switch-mode power supply converter configured to power the second RF amplifier. The service or the utility provided by the auxiliary circuit may be generating and providing a supply voltage to the second RF amplifier. The auxiliary circuit may provide the supply voltage to the second RF amplifier via the auxiliary signals interface. As another example, the auxiliary circuit may include control circuitry having a first control interface in communication with the first RF amplifier, a second control interface in communication with the second RF amplifier, and a control bus interface. The second control interface may provide or receive control signals for the second RF amplifier to the auxiliary signals interface. In some embodiments, the control circuitry may further provide RF switch control signals to RF switch circuitry. For example, the control circuitry may provide the RF switch control signals to the RF switch circuitry via the auxiliary signals interface. In still other embodiments, some portion of the RF switch circuitry may be in the same electronic package that includes the first RF amplifier and the auxiliary circuit. The control circuitry may provide the RF switch control signals to the RF switch circuitry. In this case, the control circuitry may provide a service or a utility to both the first RF amplifier and the second RF amplifier independent of a transmit enable state of the first RF amplifier and a transmit enable state of the second RF amplifier.

In some embodiments, the control circuitry may include a MIPI RFFE control circuit. In some embodiments, the control bus interface may communicate with a controller or microprocessor. In other embodiments, the auxiliary circuit may include an RF switch circuit. The RF switch circuit may receive the first RF output signal and the second RF output signal. The RF switch circuit may selectively provide the first RF output signal and the second RF output signal to an antenna for transmission. In other embodiments, the control circuitry may configure the RF switch circuit to switchably couple the antenna to one of several switch ports to provide a modulated RF receiver signal.

FIG. 1 depicts an embodiment of an electronic device 10 having a multimode RF amplifier system 20. Embodiments of the electronic device 10 may include a communication device, a mobile terminal, an information device, a computing device, a sensor system, an entertainment device, and/or some combination thereof. Embodiments of the electronic device 10 may be configured to operate in a variety of modes and within various communication networks. As a non-limiting list of examples of communication networks and modes of modulation, some embodiments of the electronic device 10 may be configured to operate in some combination of a 2G Global System for Mobile Communications (GSM)-based communication network, various embodiments of a 3G communication network, embodiments of a 4G Long Term Evolution (LTE) communication network, and embodiments of a Time Division Long Term Evolution (TD-LTE) communication network. Some embodiments of the electronic device 10 may include a digital baseband circuit or a digital modem circuit configured to interface with the multimode RF amplifier system 20.

For example, in some embodiments, the multimode RF amplifier system 20 may support a combination of a GSM-based communication network and at least one of the various embodiments of an LTE communication network. As an example, the multimode RF amplifier system 20 may support a 3G communication network. In still other embodiments, the multimode RF amplifier system 20 may further support an embodiment of a 4G LTE communication network. As another example, in some embodiments, the multimode RF amplifier system 20 may support a combination of a TD-LTE communication network and at least one of the 3G communication network and the 4G LTE communication network.

FIG. 1 further depicts a block diagram of an embodiment of the multimode RF amplifier system 20 including a first RF amplifier 22, a second RF amplifier 24, a controller 26, and RF switch circuitry 28. The controller 26 may be a processor. In some embodiments, the controller 26 may be a portion of or in communication with a digital baseband circuit or a digital modem circuit (not shown) of the electronic device 10. As another example, some embodiments of the multimode RF amplifier system 20 may include two or more modules or electronic packages configured to support multiple RF communication standards. For example, a first electronic package may include the first RF amplifier 22. A second electronic package may include the second RF amplifier 24.

The first RF amplifier 22 may include a first RF amplifier circuit 30 and auxiliary circuitry 32. The first RF amplifier 22 may be configured to support one or more RF communication standards, operational modes of an RF communication standard, one or more frequency bands associated with an RF communication standard, and/or some combination thereof. The first RF amplifier circuit 30 may also be configured to support one or more RF communication standards, operational modes of an RF communication standard, one or more frequency bands associated with an RF communication standard, and/or some combination thereof.

The first RF amplifier 22 may receive one or more supply voltages 34. The one or more supply voltages 34 may be received from one or more power supply sources. For example, in some embodiments, the supply voltages 34 may include multiple supply voltages. In other embodiments, the supply voltages 34 may include only one supply voltage. For example, the one or more supply voltages 34 may include a battery voltage received from a battery used to power the electronic device 10. As another non-limiting example, the supply voltages 34 may be generated by a buck RF switching converter, a boost RF switching converter, a buck/boost RF switching converter, a charge pump, a multiple output charge pump, a linear regulator, a low-dropout linear regulator, a battery, and/or some combination thereof.

The first RF amplifier 22 may receive one or more first modulated RF input signals 36. The first RF amplifier 22 may provide the first modulated RF input signals 36 to the first RF amplifier circuit 30. As an example, the electronic device 10 may generate a respective one of the first modulated RF input signals 36 to be transmitted. The first RF amplifier circuit 30 may generate a respective one of first modulated RF output signals 38 as a function of the respective one of the first modulated RF input signals 36 to be transmitted. The first RF amplifier 22 may provide the respective one of the first modulated RF output signals 38 to be transmitted to the RF switch circuitry 28.

In some embodiments, the electronic device 10 may generate the respective one of the first modulated RF input signals 36 based on a mode of operation of the electronic device 10 and/or the available communication network. For example, in some embodiments, the electronic device 10 may be configured to operate in a selected band of operation as a function of a selected modulation scheme or standard. As a non-limiting example, the respective one of the first modulated RF input signals 36 may include a low band GSM transmit signal or a high band GSM transmit signal.

In some embodiments, the electronic device 10 may be configured as a quad-band GSM communication system. As an example, the electronic device 10 may selectively provide the first RF amplifier circuit 30 with a respective one of the first modulated RF input signals 36 as a low band GSM transmit signal for operating in a 900 MHz band of a 2G GSM network, a high band GSM transmit signal for operating in a 1800 MHz band of a 2G GSM network, a low band GSM transmit signal for operating in an 850 MHz band of a 2G GSM network, and a high band GSM transmit signal for operating in a 1900 MHz band of a 2G GSM network for transmission. In some embodiments, the first RF amplifier circuit 30 may include a low band RF amplifier circuit and a high band RF amplifier circuit. The low band RF amplifier circuit may be configured to receive the low band GSM transmit signals and the high band RF amplifier circuit may be configured to receive the high band GSM transmit signals. The low band RF amplifier circuit may generate a low band GSM output signal in response to the low band GSM transmit signals. The low band RF amplifier circuit may provide the low band GSM output signal as the respective one of the first modulated RF output signals 38. Alternatively, the high band RF amplifier circuit may generate a high band GSM output signal in response to the high band GSM transmit signals. The high band RF amplifier circuit may provide the high band GSM output signal as the respective one of the first modulated RF output signals 38.

In some embodiments, the electronic device 10 may be configured as a tri-band GSM communication device. As an example, the first RF amplifier 22 may be configured to operate in three frequency bands of operation. In some embodiments, the first modulated RF input signals 36 may include the low band GSM transmit signal for operating in the 850 MHz band of a 2G GSM network, the high band GSM transmit signal for operating in the 1800 MHz band of the 2G GSM network, and the high band GSM transmit signal operating in the 1900 MHz band of the 2G GSM network. In some alternative embodiments, the first modulated RF input signals 36 may include the low band GSM transmit signal for operating in the 900 MHz band of the 2G GSM network, the high band GSM transmit signal for operating in the 1800 MHz band of the 2G GSM network, and the high band GSM transmit signal for operating in the 1900 MHz band of the 2G GSM network.

In some embodiments, the first modulated RF input signals 36 may further include a respective first modulated RF input signal 36 to support a general packet radio service (GPRS). As an example, in some embodiments, the respective one of the first modulated RF input signals 36 may include an eight phase-shift keying (8-PSK) encoded input signal to support a 2.5G data service, a 2.75G data service, and/or a combination thereof provided by a communication network. As a non-limiting example, the first modulated RF input signals 36 may include an 8-PSK encoded transmit signal to support an Enhanced Data Rates for a GSM Evolution (EDGE) service. The EDGE service may also be referred to as an enhanced GPRS (EGPRS) service.

The controller 26 may configure the first RF amplifier circuit 30 to generate a respective one of the first modulated RF output signals 38 as a function of one of the first modulated RF input signals 36. For example, the controller 26 may include a first control interface configured to send and/or receive one or more first control signals 40 to or from the first RF amplifier 22. In some embodiments, the first RF amplifier 22 may provide the first control signals 40 to the first RF amplifier circuit 30 and the auxiliary circuitry 32. The controller 26 may configure the first RF amplifier circuit 30 to transmit the respective one of the first modulated RF output signals 38 as a function of the first control signals 40.

As a non-limiting example list, in some embodiments, the first control signals 40 may include a transmit enable signal, a first RF amplifier circuit enable signal, one or more band select signals, one or more power mode signals, calibration signals, a power detector signal, one or more band select signals, one or more mode of operation control signals, a gain control signal, an output power mode signal, and/or some combination thereof. As a further non-limiting example, in some embodiments, the first control signals 40 may include a target supply voltage.

As a further example, in some embodiments, the target supply voltage may be a $V_{RAMP}$ signal. In some embodiments, the $V_{RAMP}$ signal may be a differential signal. In still other embodiments, the $V_{RAMP}$ signal may be a digital signal or a differential digital signal. In addition, in some embodiments, the first control signals 40 may include auxiliary circuitry control signals. As an example, the auxiliary circuitry control signals may include the $V_{RAMP}$ signal for the second RF amplifier 24. As another example, the auxiliary circuitry control signals may include an auxiliary circuit enable signal. In still other embodiments, the controller 26 may provide only one $V_{RAMP}$ signal that may be operationally shared. For example, in some modes of operation of the multimode RF amplifier system 20, the controller 26 may use the only one $V_{RAMP}$ signal to govern an operation of the first RF amplifier 22 and the second RF amplifier 24.

As another non-limiting example, in some embodiments, the first control signals 40 may include one or more control bus signals configured to form a serial control bus or a parallel control bus. In some embodiments, the control bus signals may include a MIPI RFFE control bus. For example, the controller 26 may include a MIPI RFFE control circuit configured to interface with the MIPI RFFE control bus. The first RF amplifier 22 may include a MIPI RFFE control circuit configured to interface with the MIPI RFFE control bus. In some embodiments, the first RF amplifier circuit 30 may include a MIPI RFFE control circuit configured to interface with the MIPI RFFE control bus.

The first RF amplifier 22 may include a corresponding first control interface configured to receive and/or send the first control signals 40. As an example, in some embodiments, the controller 26 may configure the first RF amplifier circuit 30 to operate in a high-gain mode of operation or a low-gain mode of operation. In the high-gain mode of operation, the first RF amplifier circuit 30 may operate in a high-power output mode. In the low-gain mode of operation, the first RF amplifier circuit 30 may operate in a low-power output mode.

The controller 26 may also include a second control interface configured to send and/or receive one or more second control signals 42 to the second RF amplifier 24. The second RF amplifier 24 may include a corresponding second control interface configured to receive and/or send the second control signals 42. The controller 26 may govern the operation of the second RF amplifier 24 as a function of the second control signals 42. Similar to the first control signals 40, in some embodiments, the second control signals 42 may include a transmit enable signal, a first RF amplifier circuit enable signal, one or more band select signals, one or more power mode signals, calibration signals, a power detector signal, one or more mode of operation control signals, a gain control signal, an output power mode signal, and/or some combination thereof. As a further non-limiting example, in some embodiments, the second control signals 42 may include a target supply voltage. In some embodiments, the target supply voltage may be a $V_{RAMP}$ signal. In addition, in some embodiments, the second control signals 42 may include one or more control bus signals configured to form a serial control bus or a parallel control bus. For example, control bus signals may be for a MIPI RFFE control bus. In some embodiments, the second RF amplifier 24 may provide a $V_{RAMP}$ signal via auxiliary signals 46 to the auxiliary circuitry 32. The auxiliary circuitry 32 may generate one or more supply voltages as a function of the $V_{RAMP}$ signal provided by the second RF amplifier 24.

As another example, the controller 26 may configure the second RF amplifier 24 to operate in a selected band of operation based on a control signal received from a communication network. As yet another example, the controller 26 may configure the second RF amplifier 24 to support one or more of the various embodiments of the 3G communication network standards and/or the several embodiments of the 4G LTE communication network standards. For example, the controller 26 may configure the second RF amplifier 24 to operate within one of the allocated frequency bands for a 3G communication network.

The controller 26 may further include an RF switch control interface configured to send and/or receive one or more RF switch control signals 44 to the RF switch circuitry 28. The RF switch circuitry 28 may include a corresponding RF switch control interface configured to receive and/or send the RF switch control signals 44. As an example, some embodiments of the RF switch circuitry 28 may include an RF switch circuit having an antenna port, multiple switch ports, and a switch circuit control interface. The switch circuit control interface may be in communication with the controller 26 via the RF switch control signals 44. The controller 26 may configure the RF switch control signals 44 to control the operation of the RF switch circuit as a function of a modulation mode in which the electronic device 10 is configured to operate. In some embodiments, the RF switch circuitry 28 may include a MIPI RFFE control circuit. Similar to the first control signals 40 and the second control signals 42, in some embodiments, the RF switch control signals 44 may include a MIPI RFFE control bus.

In some embodiments, the first control interface and the second control interface of the controller 26, the first RF amplifier 22, and the second RF amplifier 24 may include digital output interfaces, digital input interfaces, analog output interfaces, and analog input interfaces. For example, in some embodiments, the controller 26 may be configured to read or write various parameter values, control settings, and register values to the first RF amplifier 22 to govern the operation of the first RF amplifier circuit 30 and the auxiliary circuitry 32. In other embodiments, the controller 26 may assert and/or de-assert the first control signals 40 to govern the operation of the first RF amplifier 22, the first RF amplifier circuit 30, the auxiliary circuitry 32, and/or some combination thereof. In still other embodiments, the controller 26 may sense a signal level of at least one of the first control signals 40 to detect an interrupt signal, a status, an operational mode, an error condition, a calibration state, a calibration value, and/or some combination thereof. In some embodiments, the controller 26 may include an analog-to-digital converter configured to receive an analog level signal from the first RF amplifier 22. As another example, the controller 26 may configure the auxiliary circuitry 32 to generate or receive one or more of the auxiliary signals 46 via the first control signals 40.

In some embodiments, the auxiliary circuitry 32 may include an auxiliary signal interface configured to provide one or more of the auxiliary signals 46 to the second RF amplifier 24. In other embodiments, the auxiliary signal interface may be further configured to receive one or more of the auxiliary signals 46 from the second RF amplifier 24. In still other embodiments, the second RF amplifier 24 may provide the auxiliary signals 46 that include control signals, feedback signals, feed-forward control signals, power supply signals, supply voltages, data signals, analog signals, and digital data signals.

Some embodiments of the auxiliary circuitry 32 may be configured to provide a service or a utility to the second RF amplifier 24 while the first RF amplifier circuit 30 is disabled. In other embodiments, the auxiliary circuitry 32 may be further configured to provide a service or a utility to both the first RF amplifier 22 and the second RF amplifier 24. In still other embodiments, the auxiliary circuitry 32 may be configured to provide a service or a utility to a portion of the electronic device 10 to generate one or more second modulated RF output signals 52 that are unsupported by the first RF amplifier circuit 30. As another example, some embodiments of the auxiliary circuitry 32 may be configured to provide a service or a utility to the second RF amplifier 24 as a function of a selected modulation mode or a characteristic of a data transmission to be sent by the electronic device 10. Some embodiments of the auxiliary circuitry 32 may include multiple auxiliary circuits to provide two or more services or utilities. For example, a first service or utility may include generating a supply voltage to be provided to a second RF amplifier circuit 48. A second service or utility may be to provide a control function to the second RF amplifier circuit 48 or the second RF amplifier 24. For example, the second RF amplifier 24 may be configured to support one or more RF communication standards, operational modes of an RF communication standard, one or more frequency bands associated with an RF communication standard, and/or some combination thereof. Similarly, the second RF amplifier circuit 48 may be configured to support one or more RF communication standards, operational modes of an RF communication standard, one or more frequency bands associated with an RF communication standard, and/or some combination thereof.

As an example, in some embodiments, the second RF amplifier 24 may include an auxiliary signals interface configured to receive and provide the one or more auxiliary signals 46. In some embodiments, the auxiliary signals 46 may include one or more supply voltages generated by the auxiliary circuitry 32 to enable the operation of the second RF amplifier 24. For example, the one or more supply voltages may correspond to one or more supply voltages provided to the second RF amplifier circuit 48 while the first RF amplifier circuit 30 is disabled.

In some embodiments, the auxiliary signals 46 may include an analog measurement signal of a temperature or a voltage associated with the second RF amplifier 24. As another example, the second RF amplifier 24 may be configured to selectively provide a temperature measurement of a portion of the second RF amplifier circuit 48 as one of the auxiliary signals 46 to the first RF amplifier 22. The second RF amplifier 24 may be further configured to provide an analog measurement of a supply voltage used by the second RF amplifier circuit 48. In some alternative embodiments, the second RF amplifier 24 may provide the analog measurement signal to the controller 26 as one of the second control signals 42.

The second RF amplifier 24 may include the second RF amplifier circuit 48. The second RF amplifier 24 may receive one or more second modulated RF input signals 50. In some embodiments, the controller 26 may configure the second RF amplifier 24 to provide one of the second modulated RF input signals 50 to the second RF amplifier circuit 48. In other embodiments, the second RF amplifier circuit 48 may be configured to receive a respective one of the second modulated RF input signals 50. In addition, the second RF amplifier circuit 48 may include one or more second RF amplifier outputs configured to selectively generate the second modulated RF output signals 52. As an example, the controller 26 may generate band select signals to configure the second RF amplifier circuit 48 and the second RF amplifier 24 to generate a selected one of the second modulated RF output signals 52. The second RF amplifier 24 may provide the generated one of the second modulated RF output signals 52 to the RF switch circuitry 28 for transmission.

The RF switch circuitry 28 may include an antenna interface in communication with an antenna signal path 54. The antenna signal path 54 may provide a communication path between the antenna interface of the RF switch circuitry 28 and an antenna 56. In some embodiments, the antenna signal path 54 may include front-end circuitry configured to couple the antenna 56 to the RF switch circuit of the RF switch circuitry 28. In some embodiments, the antenna signal path 54 may include a transmission line. The impedance of the transmission line at the antenna 56 may be substantially matched to an impedance of the antenna 56. In addition, the impedance of the transmission line at the RF switch circuitry 28 may be substantially matched to the impedance of the RF switch circuitry 28. The RF switch circuitry 28 may be configured to output one or more modulated RF receiver signals 58. In some embodiments, the modulated RF receiver signals 58 may be a differential signal.

In some embodiments, the RF switch circuitry 28 may include filter circuitry (not shown) and front-end circuitry (not shown) configured to interface with the RF switch circuit of the RF switch circuitry 28. As an example, the filter circuitry may include a number of filter circuits. In some embodiments, some of the filter circuits may include a filter input and a filter output. As a further example, some of the filter circuits may include a surface acoustic wave (SAW) filter. In some embodiments, some of the filter circuits may be configured as duplexer circuits. For example, each duplexer circuit may include an antenna port, a transmit signal port, and a receive signal port.

The RF switch circuit may switchably couple the antenna 56 to one of the number of switch ports of the RF switch circuit based on the RF switch control signals 44 provided to the RF switch circuitry 28. For example, in some embodiments, the RF switch circuitry 28 may provide each of the first modulated RF output signals 38 to a respective switch port. Each of the first modulated RF output signals 38 may be associated with a respective one of the modulated RF receiver signals 58.

To obtain the respective one of the modulated RF receiver signals 58, the RF switch circuit may switchably couple the antenna port of the RF switch circuit to a filter circuit configured to obtain the respective one of the modulated RF receiver signals 58. The filter circuit may band-pass filter the signal present at the antenna port of the RF switch circuit to obtain the respective one of the modulated RF receiver signals 58.

As a non-limiting example, the controller 26 may configure the first RF amplifier 22 to generate a GSM high band transmit signal as the generated one of the first modulated RF output signals 38 to be transmitted. The controller 26 may further configure the RF switch circuitry 28 to switchably provide the GSM high band transmit signal to the antenna 56. In addition, the controller 26 may configure the RF switch circuit to switchably couple the antenna 56 to a filter input of a filter circuit configured as a GSM high band receive filter. The GSM high band receive filter may band-pass filter the GSM high band receive signal to provide a GSM high band receiver signal as one of the modulated RF receiver signals 58.

In a similar fashion, the controller 26 may configure the first RF amplifier 22 to generate a GSM low band transmit signal as the generated one of the first modulated RF output signals 38 for transmission. The controller 26 may further configure the RF switch circuitry 28 to switchably provide the GSM low band transmit signal to the antenna 56. In addition, the controller 26 may configure the RF switch circuit to switchably couple the antenna 56 to a filter input of a filter circuit configured as a GSM low band receive filter. The GSM low band receive filter may band-pass filter the GSM low band receive signal to provide a GSM low band receiver signal as one of the modulated RF receiver signals 58.

In some embodiments, the RF switch circuitry 28 may include a duplexer circuit for each of the second modulated RF output signals 52. As an example, the second RF amplifier 24 may be configured to provide each of the second modulated RF output signals 52 to a transmit signal port of a respective duplexer circuit. The controller 26 may configure the RF switch circuit to switchably couple the receive signal port of the respective duplexer circuit to the antenna port of the respective duplexer circuit. The respective duplexer circuit may band-pass filter the signal present at the antenna port of the RF switch circuit to provide a respective one of the modulated RF receiver signals 58 that is associated with the one of the second modulated RF output signals 52 provided to the transmit signal port of the respective duplexer circuit. The antenna port of each of the respective duplexer circuits may be in communication with a respective switch port of the RF switch circuit.

As an example, in some embodiments, the RF switch circuitry 28 may include a duplexer circuit configured to support one of the 3G frequency bands. The controller 26 may configure the RF switch circuit to switchably couple the antenna 56 to the antenna port of the duplexer circuit. The electronic device 10 may generate a respective one of the second modulated RF input signals 50 that corresponds to the one of the 3G frequency bands in which the electronic device 10 is configured to operate. The duplexer circuit may obtain a respective one of the modulated RF receiver signals 58 as an output at the receive signal port of the duplexer. In some alternative embodiments, the second RF amplifier 24 may include the duplexer circuits.

As yet another operational example, the controller 26 may govern the operation of the second RF amplifier 24 via the second control signals 42. As an example, the controller 26 may read or write various parameter values, control settings, and register values of the second RF amplifier 24 to govern the operation of the second RF amplifier circuit 48. In other embodiments, the controller 26 may assert and/or de-assert one or more of the second control signals 42 to govern the operation of the second RF amplifier 24. In still other embodiments, the controller 26 may sense a signal level of one or more of the second control signals 42 to detect an interrupt signal, a status, an operational mode, an error condition, a calibration state, a calibration value, and/or some combination thereof related to the operation of the second RF amplifier 24. In some embodiments, the controller 26 may include an analog-to-digital converter configured to receive an analog level signal from the second RF amplifier 24.

As an example, the controller 26 may govern operation and/or determine the status of the second RF amplifier circuit 48 via the second control signals 42. For example, the controller 26 may read and/or write various parameter values, control settings, and register values of the second RF amplifier circuit 48. The controller 26 may configure the second RF amplifier circuit 48 as a function of the various parameter values, control settings, and register values. In addition, in some embodiments, some of the second control signals 42 may provide various control level signals to set a mode of operation of the second RF amplifier 24. For example, the controller 26 may generate one or more of the second control signals 42 to set a gain of the second RF amplifier circuit 48 and/or calibrate portions of the second RF amplifier circuit 48. As another example, the controller 26 may set one or more of the second control signals 42 to configure the second RF amplifier 24 to generate a respective one of the second modulated RF output signals 52 with a respective one of the second modulated RF input signals 50.

As a further example, in some embodiments, the first RF amplifier 22 may be configured to provide an analog measurement signal to the controller 26. For instance, the first RF amplifier 22 may provide an analog temperature measurement signal corresponding to a temperature measurement for a portion of the first RF amplifier 22 to the controller 26. The temperature measurement may correspond to a temperature of the first RF amplifier circuit 30, the auxiliary circuitry 32, a portion of the auxiliary circuitry 32, or some combination thereof. In some embodiments, the first RF amplifier 22 may be configured to selectively provide a temperature measurement of one of the portions, circuits, sub-circuits, circuitry, or sub-circuitry of the first RF amplifier 22 as the analog measurement signal. As another example, the first RF amplifier 22 may be further configured to selectively provide an analog measurement signal based on one of the supply voltages 34 provided to the first RF amplifier 22.

As another example, in some embodiments, the first RF amplifier 22 may be configured to provide a voltage measurement of the battery voltage as the analog measurement signal to the controller 26. In still other embodiments, the first RF amplifier 22 may be configured to further provide a voltage measurement of a supply voltage to the first RF amplifier circuit 30 as the analog measurement signal.

As still another example, in some embodiments, the auxiliary circuitry 32 may include a digital-to-analog converter. In some embodiments, the controller 26 may configure the auxiliary circuitry 32 to digitize a selected one of the auxiliary signals 46 generated by the second RF amplifier 24. As an example, the auxiliary circuitry 32 may digitize the selected one of the auxiliary signals 46 and provide a digital measurement of the selected one of the auxiliary signals 46 to the controller 26 via the first control signals 40. In some embodiments, the service or the utility of the digital-to-analog converter may be used only to sample the auxiliary signals 46 generated by the second RF amplifier 24 or provided to the second RF amplifier 24. In other embodiments, the digital-to-analog converter may provide a service or a utility to both the first RF amplifier 22 and the second RF amplifier 24.

In some embodiments, the one or more first control signals 40 may include a target supply voltage. As a non-limiting example, in some embodiments, the target supply voltage may be a $V_{RAMP}$ signal. The auxiliary circuitry 32 may use a target supply voltage to generate one or more supply voltage voltages provided to the second RF amplifier 24. In some embodiments, the target supply voltage may be provided from the second RF amplifier 24 to the auxiliary circuitry 32 as one of the auxiliary signals 46. The auxiliary circuitry 32 may use the target supply voltage to generate a modulated supply voltage that is provided to an output stage of the second RF amplifier circuit 48. In addition, in some embodiments, the first RF amplifier 22 may be selectively configured to provide an analog voltage measurement of the supply voltages generated by the auxiliary circuitry 32 to the controller 26.

As another example, the first control signals 40 may include a first transmit enable signal provided to the first RF amplifier 22. The first RF amplifier circuit 30 may operate in a transmit enabled state and a transmit disabled state. The controller 26 may de-assert the first transmit enable signal to disable generation of the first modulated RF output signals 38. As an example, in response to de-assertion of the first transmit enable signal, the first RF amplifier 22 may set the transmit enable state of the first RF amplifier circuit 30 to the transmit disabled state. Alternatively, the controller 26 may assert the first transmit enable signal to enable the first RF amplifier 22 to transmit a respective one of the first modulated RF output signals 38.

Similarly, as another example, the first control signals 40 may further include an auxiliary circuitry enable signal having an on state and an off state. The controller 26 may enable the auxiliary circuitry 32 by asserting the auxiliary circuitry enable signal. The controller 26 may disable the auxiliary circuitry 32 by de-asserting the auxiliary circuitry enable signal.

In some embodiments of the first RF amplifier 22, the operation of the first RF amplifier circuit 30 and the auxiliary circuitry 32 may be mutually exclusive. As an example, the controller 26 may configure the auxiliary circuitry 32 to be in an off state while the first RF amplifier circuit 30 is in an on state. The controller 26 may configure the first RF amplifier circuit 30 to be in an off state while the auxiliary circuitry 32 is in an on state. In some embodiments, the first control signals 40 may include a transmit enable signal configured to enable and disable the first RF amplifier circuit 30. The controller 26 may assert the transmit enable signal to enable the first RF amplifier 22 to generate the first modulated RF output signals 38 as a function of the one of the first modulated RF input signals 36. In some embodiments, the first RF amplifier 22 may automatically disable the auxiliary circuitry 32 based on the assertion of the transmit enable signal. Similarly, the controller 26 may de-assert the transmit enable signal to disable the first RF amplifier circuit 30, and automatically enable the auxiliary circuitry 32 based on the de-assertion of the transmit enable signal.

Returning to the description of the auxiliary circuitry 32, some embodiments of the auxiliary circuitry 32 may provide a utility or a service to the second RF amplifier 24 that is not used by the first RF amplifier 22 to generate the first modulated RF output signals 38. As a non-limiting example of the utility or the service provided by the auxiliary circuitry 32, in some embodiments, the auxiliary circuitry 32 may provide a service or a utility to the second RF amplifier 24 to enable the second RF amplifier circuit 48 to generate a respective one of the second modulated RF output signals 52.

For example, in some embodiments, the auxiliary circuitry 32 may include a power supply circuit configured to generate supply voltages to enable the operation of the second RF amplifier 24. In some embodiments, a supply voltage may include a modulated supply voltage that is substantially related to a target supply voltage. For example, the target supply voltage may be related to an envelope of a respective one of the second modulated RF input signals 50 to be transmitted.

In some embodiments, the supply voltages generated by the auxiliary circuitry 32 are provided to the second RF amplifier circuit 48. The second RF amplifier circuit 48 may use the generated supply voltages to generate a respective one of the second modulated RF output signals 52. However, the auxiliary circuitry 32 may not provide the supply voltages to the first RF amplifier circuit 30. As an example, in some embodiments, the supply voltages generated by the auxiliary circuitry 32 may not be used by the first RF amplifier 22 to generate any of the first modulated RF output signals 38. As a result, the first RF amplifier 22 or the controller 26 may disable the power supply circuit of the auxiliary circuitry 32 while the first RF amplifier circuit 30 is generating a respective one of the first modulated RF output signals 38.

As another example, the auxiliary circuitry 32 may provide one or more supply voltages as the auxiliary signals 46 to the second RF amplifier 24. The supply voltages may be provided to the second RF amplifier 24. In some embodiments, the voltage level of the supply voltages may be a function of the supply voltages 34 and the target supply voltage. For example, the supply voltages may be generated as a function of a $V_{RAMP}$ signal. The second RF amplifier circuit 48 may use the one or more supply voltages to generate a respective one of the second modulated RF output signals 52. In some embodiments, the auxiliary circuitry 32 may disable the first RF amplifier circuit 30 while generating the supply voltages for the second RF amplifier 24.

As a further example, the first control signals 40 may include one or more band select control signals. The band select control signals may select a band of operation of the first RF amplifier 22. As an example, the first RF amplifier 22 may include a first RF signal path and a second RF signal path. The first RF amplifier circuit 30 may include a high band RF amplifier circuit and a low band RF amplifier circuit. The first RF signal path may include the high band RF amplifier circuit. The second RF signal path may include the low band RF amplifier circuit. Based on the band select signals, the first RF amplifier 22 may configure the first RF amplifier circuit 30 to enable one of the high band RF amplifier circuit and the low band RF amplifier circuit. As an example, the band select control signals may further configure the first RF signal path to operate in one of the 1800 MHz band or the 1900 MHz band. The band select control signals may further configure the second RF signal path to operate in one of the 850 MHz band or the 900 MHz band. The first RF amplifier 22 may be configured to disable those portions of the first RF amplifier 22 that are unused as a function of the band selected for transmission.

The first control signals 40 may further include one or more power mode signals to govern the gain of the first RF amplifier 22 while generating the one or more first modulated RF output signals 38. As an example, the power mode signals may configure the first RF amplifier 22 to operate in a high power mode, a medium power mode, a low power mode, and/or an ultra low power mode. In response to the power mode signals, the first RF amplifier 22 may adjust a quiescent current or bias current to maintain linear operation of the first RF amplifier 22 during a data transmission.

In some embodiments, the first control signals 40 may further include one or more modulation mode signals. For example, the controller 26 may selectively set the one or more modulation mode signals to select a different modulation mode. Based on the modulation mode, the first RF amplifier 22 may be configured to provide a respective one of the first modulated RF output signals 38. For example, the first RF amplifier 22 and the first RF amplifier circuit 30 generate a high band GSM output signal as a function of a first modulation mode. The first RF amplifier 22 and the first RF amplifier circuit 30 generate a Wideband Code Division Multiplexing (WCDM) modulated output signal for transmission as a function of a second modulation mode.

As another example, the first control signals 40 may further include one or more calibration control signals. The controller 26 may use the calibration control signals to calibrate the first RF amplifier 22, the first RF amplifier circuit 30, and the auxiliary circuitry 32.

For instance, the first control signals 40 may further include one or more auxiliary circuitry control signals to configure the auxiliary circuitry 32 to provide a utility or service. For example, the controller 26 may set the auxiliary circuitry control signals to govern the operation of the auxiliary circuitry 32 to provide a selected utility or service to the second RF amplifier 24. For example, the auxiliary circuitry control signals may configure the auxiliary circuitry 32 to provide at least one supply voltage to the second RF amplifier 24.

The second control signals 42 may include control signals similar to the first control signals 40. For example, the one or more second control signals 42 may include one or more band select control signals, power mode signals, modulation mode signals, a transmit enable signal, and/or a combination thereof.

As an example, the second control signals 42 may include one or more modulation mode signals. The modulation mode signals may configure the second RF amplifier 24 to operate in one of a number of modulation modes. As a non-limiting example, the modulation mode signals may configure the second RF amplifier 24 to generate one of the one or more second modulated RF output signals 52 as a function of a selected modulation algorithm or scheme. Example modulation algorithms or schemes may include Gaussian minimum-shift keying (GMSK) modulation, 8-PSK modulation, Wideband Code Division Multiple Access (W-CDMA) modulation, or orthogonal frequency division multiple access (OFDMA) modulation. The band select signals may configure the second RF amplifier 24 to generate a respective one of the one or more second modulated RF output signals 52 in a particular band of operation of the communication network. The power mode signals may configure the second RF amplifier circuit 48 to operate in a desired output power mode or along a selected iso-gain curve. As a non-limiting list of examples of power modes, the power mode signals may configure the second RF amplifier circuit 48 to operate in a high power mode, a medium power mode, a low power mode, an ultra low power mode, and a standby mode based on control information provided to the electronic device 10 from the communication network.

In some embodiments, the auxiliary signals 46 may include one or more feedback signals, feed-forward signals, or control signals generated by the second RF amplifier 24. As an example, the second RF amplifier 24 may provide a feedback voltage or current to the auxiliary circuitry 32. The auxiliary circuitry 32 may use the feedback voltage or current to regulate a supply voltage provided to the second RF amplifier circuit 48.

As another example, the controller 26 may configure the auxiliary circuitry 32 to generate supply voltages to enable the second RF amplifier circuit 48. The controller 26 may configure the auxiliary circuitry 32 to provide a regulated DC supply voltage to the second RF amplifier circuit 48. As another example, the second RF amplifier 24 may configure the auxiliary circuitry 32 to operate as one of a buck switch-mode power supply, a boost switch-mode power supply, a buck/boost switch-mode power supply, or a pseudo-envelope tracking power supply.

In some embodiments, the multimode RF amplifier system 20 may include multiple packages of integrated circuits, integrated circuit modules, discrete components, and/or combinations thereof. For example, in some embodiments, the multimode RF amplifier system 20 may include a first package that includes the first RF amplifier 22 and a second package that includes the second RF amplifier 24. In some embodiments, the multimode RF amplifier system 20 may include a third package that includes the RF switch circuitry 28. In some embodiments, the controller 26 may be remote from the multimode RF amplifier system 20.

Figure 2:
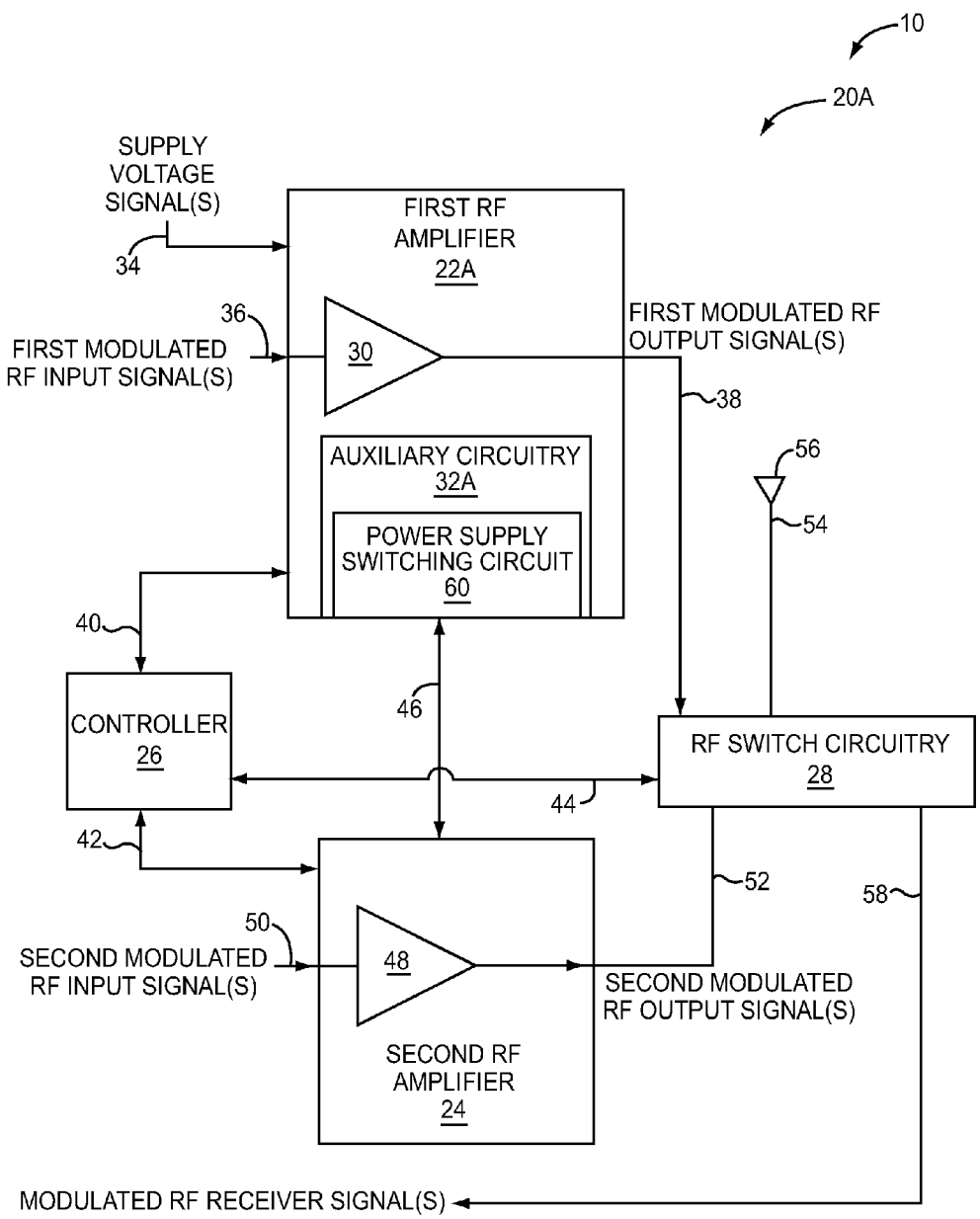
FIG. 2 illustrates another embodiment of the communication device or mobile terminal that includes another example of a multimode RF amplifier system having an auxiliary circuit configured as a power supply switching circuit.

FIG. 2 depicts a block diagram of an embodiment of a multimode RF amplifier system 20A configured to provide the supply voltages from first RF amplifier 22A to the second RF amplifier 24. The multimode RF amplifier system 20A may include an embodiment of auxiliary circuitry 32A having a power supply switching circuit 60. The power supply switching circuit 60 may provide the supply voltages to the second RF amplifier 24 as one or more supply voltages. As an example, the auxiliary signals 46 may include the supply voltages provided to the second RF amplifier 24. In some embodiments, the power supply switching circuit 60 may generate at least one of the supply voltages as a function of an expected output power of a respective one of the second modulated RF output signals 52 to be transmitted. In some embodiments, at least one of the supply voltages is generated as a function of an envelope of the respective one of the second modulated RF output signals 52 to be transmitted.

In some embodiments, the electronic device 10 may be configured to operate in a communication network using a modulation algorithm, scheme, or frequency band that is unsupported by the first RF amplifier 22A. As another example, the electronic device 10 may receive a user input to a user interface or via a user interface device to select a mode of operation that is supported by the second RF amplifier 24. In response, the controller 26 may configure the first RF amplifier circuit 30 to cease transmission or disable the first RF amplifier circuit 30. The controller 26 may configure the power supply switching circuit to generate at least one of the supply voltages as a function of a mode of operation of the second RF amplifier 24 or the second RF amplifier circuit 48.

As a non-limiting example, in some embodiments, the controller 26 may provide the power supply switching circuit 60 with a target supply voltage level for at least some of the supply voltages to be generated. For example, in some embodiments, the target supply voltage level may be a DC voltage level. In some embodiments, the target supply voltage level may be based on a minimum voltage parameter associated with a sub-circuit of the second RF amplifier circuit 48.

As an example, in some embodiments, the second RF amplifier circuit 48 may include a driver circuit, biasing circuitry, Complementary Metal-Oxide Semiconductor (CMOS) logic circuitry, and an output stage. In some embodiments, the CMOS logic circuitry may be configured to receive a logic circuitry supply voltage. The biasing circuitry may be configured to receive a biasing circuitry supply voltage. The output stage may be configured to receive an output stage supply voltage. In some embodiments, the output stage may be configured to operate with an output stage supply voltage that is a modulated supply voltage that substantially tracks an envelope of the respective one of the second modulated RF input signals 50 to be transmitted. In some embodiments, the driver circuit may be configured to receive a driver circuit supply voltage. In other embodiments, the driver circuit may be configured to receive the output stage supply voltage.

The controller 26 may configure the power supply switching circuit 60 to generate the driver circuit supply voltage, the logic circuitry supply voltage, and the biasing circuitry supply voltage as a function of minimum voltage parameters associated with each of the driver circuit, the CMOS logic circuitry, and the biasing circuitry. The power supply switching circuit 60 may be configured to provide the driver circuit supply voltage, the logic circuitry supply voltage, and the biasing circuitry supply voltage to the second RF amplifier 24 as the auxiliary signals 46.

In some embodiments, the power supply switching circuit 60 may be a charge pump configured to generate one or more charge pump output voltages. The charge pump output voltages may be generated as a function of a charge pump clock and a voltage level of at least one of the supply voltages 34. As an example, in some embodiments, the controller 26 may configure the power supply switching circuit 60 to generate the charge pump output voltages as a function of a battery voltage. The charge pump voltages may be provided as a set of the supply voltages to the second RF amplifier 24.

As an example, some embodiments of the power supply switching circuit 60 may include a switching network, charge pump control circuitry, an output capacitor for each of the supply voltages to be generated by the charge pump, and only two flying capacitors arranged in the switching network. The charge pump control circuitry may control the switching network to switchably couple the only two flying capacitors in various arrangements with respect to one of the supply voltages 34, ground, and each of the output capacitors to generate the charge pump output voltages.

In other embodiments, the power supply switching circuit 60 may be configured to operate as a buck switching power converter to provide the one or more supply voltages to the second RF amplifier 24. As an example, the power supply switching circuit 60 may be configured to operate as a bang-bang switch-mode power converter. As an example, the controller 26 may configure the power supply switching circuit 60 to generate one or more supply voltages to enable the second RF amplifier circuit 48 to generate a respective one of the second modulated RF output signals 52. In some embodiments, the controller 26 may configure the power supply switching circuit 60 to provide a supply voltage to the output stage of the second RF amplifier circuit 48 based on an expected dynamic range of a respective one of the second modulated RF input signals 50 used to generate the respective one of the second modulated RF output signals 52. For example, the controller 26 may configure the power supply switching circuit 60 to generate the supply voltage based on a target supply voltage level to maintain linear function of the second RF amplifier circuit 48.

In other embodiments, the controller 26 may configure the power supply switching circuit 60 to operate as a boost switch-mode power supply. As an example, the controller 26 may obtain a voltage measurement of the battery voltage from the first RF amplifier 22A. Based on a target supply voltage level and the voltage measurement of the battery voltage, the controller 26 may configure the boost switch-mode power supply to generate a supply voltage that is greater than the battery voltage. The power supply switching circuit 60 may provide the supply voltage to the output stage of the second RF amplifier circuit 48. As another example, the controller 26 may configure the boost switch-mode power supply to provide a supply voltage that is substantially equal to the target supply voltage level that is greater than the battery voltage.

In still other embodiments, the power supply switching circuit 60 may be configured to operate as a buck-boost switch-mode power supply. In this case, the controller 26 may configure the power supply switching circuit 60 to generate the supply voltage to be provided to the second RF amplifier circuit 48 by either bucking or boosting the battery voltage as a function of the battery voltage and the target supply voltage level.

In still other embodiments, the power supply switching circuit 60 may be configured to operate as an envelope tracking power supply. In this case, the controller 26 may provide a target supply voltage as one of the first control signals 40. As an example, the target supply voltage may be a $V_{RAMP}$ signal. In some embodiments, the $V_{RAMP}$ signal may be a differential $V_{RAMP}$ signal. In still other embodiments, the $V_{RAMP}$ signal may be frequency-compensated to compensate for a frequency response of the power supply switching circuit 60. Based on the $V_{RAMP}$ signal, the power supply switching circuit 60 may generate a modulated supply voltage that substantially tracks the envelope of the respective one of the second modulated RF input signals 50 used to generate a respective one of the second modulated RF output signals 52 to be transmitted. The power supply switching circuit 60 may provide the modulated supply voltage to the second RF amplifier circuit 48. The second RF amplifier circuit 48 may generate the respective one of the second modulated RF output signals 52 as a function of the respective one of the second modulated RF input signals 50 and the modulated supply voltage.

Figure 3:
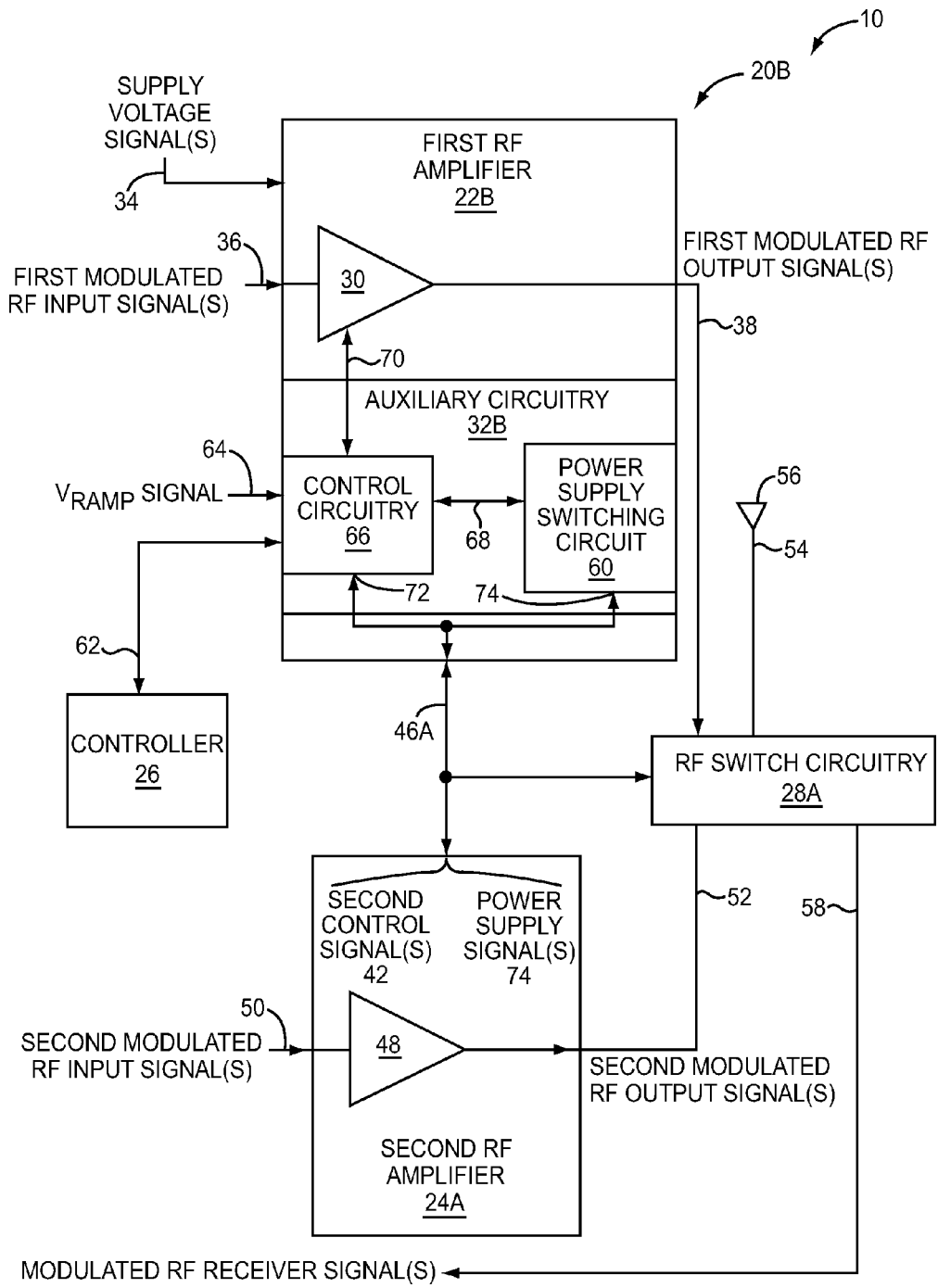
FIG. 3 illustrates another embodiment of the communication device or mobile terminal that includes an example of an auxiliary circuit having control circuitry and a power supply switching circuit.

In FIG. 3, the multimode RF amplifier system 20B includes another embodiment of first RF amplifier 22B. The first RF amplifier 22B may be in communication with the controller 26 via a control bus 62. In addition, the first RF amplifier 22B may be further configured to receive a $V_{RAMP}$ signal 64. The first RF amplifier 22B may be in communication with second RF amplifier 24A and RF switch circuitry 28A via auxiliary signals 46A.

Some embodiments of the second RF amplifier 24A and the RF switch circuitry 28A may be substantially similar to the embodiments of the second RF amplifier 24 and the RF switch circuitry 28 depicted in FIG. 1 and FIG. 2. However, as will be described below, the controller 26 may govern the operation of the second RF amplifier 24A and the RF switch circuitry 28A via the auxiliary signals 46A. In some embodiments, the auxiliary signals 46A may include some or all of the one or more RF switch control signals 44. In addition, the embodiments of auxiliary circuitry 32B may be similar to the embodiments of the auxiliary circuitry 32 and the auxiliary circuitry 32A, depicted in FIG. 1 and FIG. 2, respectively.

The auxiliary circuitry 32B may further include control circuitry 66 configured to control the second RF amplifier 24A and the RF switch circuitry 28A via the auxiliary signals 46A. As an example, the control circuitry 66 may include a control interface in communication with the control bus 62 and further configured to receive the $V_{RAMP}$ signal 64. In some embodiments, the control circuitry 66 may include a differential interface configured to receive a differential $V_{RAMP}$ signal 64. In some embodiments, the control bus 62 may be a serial control bus. In some embodiments, the control bus 62 may be a multi-signal serial control bus. For example, the control bus 62 may include a clock signal, a slave select signal, a master output slave input signal, and/or a slave output master input signal. As another example, the control bus 62 may include a two wire bus. For example, the control bus 62 may include a serial data line signal and a serial clock signal. In still other embodiments, the control bus 62 may be a single-signal control bus. For example, the control bus 62 may include a UNI/O bus that has a serial clock and a data input/output signal. In other embodiments, the control bus 62 may be a parallel control bus. The control bus 62 may be an asynchronous bus. In still other embodiments, the control bus 62 may be a synchronous bus. Additionally, the control bus 62 may include an RFFE control bus. For example, the control bus 62 may be a MIPI RFFE control bus. For example, the control bus 62 and the first RF amplifier 22B may each include a MIPI RFFE control bus interface. As a further example, the control circuitry 66 may include a MIPI RFFE control interface control circuit.

In addition, the control circuitry 66 may include control register circuitry, memory, logic unit circuitry, combinational logic, state machine circuitry, a microcontroller, digital logic circuitry, analog control circuitry, digital buffer circuitry, analog buffer circuitry, comparator circuitry, counter circuitry, control bus interface circuitry, firmware, an address decoder, read only memory (ROM), random access memory (RAM), flash memory, signal line driver circuitry, and/or a combination thereof. In some embodiments, the control circuitry 66 may further include the MIPI RFFE control bus interface. In addition, in some embodiments, the control bus 62 may further include analog interfaces, as previously described.

The control circuitry 66 may be configured to receive control information via the control bus 62 and the $V_{RAMP}$ signal 64. The controller 26 may configure the control circuitry 66 to govern the operation of the first RF amplifier 22B, the second RF amplifier 24A, and the RF switch circuitry 28A as a function of the control information. As an example, the control information may include various control signals, parameter values, control settings, and register values to govern the operation of the second RF amplifier 24A, the RF switch circuitry 28A, and the first RF amplifier circuit 30.

In some embodiments, the control circuitry 66 can be configured to send and/or receive control signals to govern the operation of the second RF amplifier 24A, the RF switch circuitry 28A, the first RF amplifier circuit 30, and the power supply switching circuit 60. As an example, the control circuitry 66 may interface with the power supply switching circuit 60 via one or more power supply control signals 68. The control circuitry 66 may interface with the first RF amplifier circuit 30 via one or more first RF amplifier control signals 70. In addition, the control circuitry 66 may interface with the auxiliary signal interface of the auxiliary circuitry 32B via one or more auxiliary control signals 72. The auxiliary control signals 72 may include control signals to govern the operation of the second RF amplifier 24A and the RF switch circuitry 28A. Similarly, the auxiliary control signals 72 may include feedback signals or control signals provided by the second RF amplifier 24A and the RF switch circuitry 28A.

In some embodiments, the controller 26 may provide control information to the control circuitry 66 via the control bus 62. In some embodiments, the control information may include a command, a register setting, a parameter setting, and/or a combination thereof. In some embodiments, the controller 26 may query the control circuitry 66 to request the control information and/or status information. For example, the controller 26 may query the control circuitry 66 to obtain a measurement of a voltage or current. In response to the control information or query, the control circuitry 66 may configure the auxiliary circuitry 32B to provide a service or a utility for the first RF amplifier 22B, the second RF amplifier 24A, the first RF amplifier circuit 30, the second RF amplifier circuit 48, and/or a combination thereof.

In addition, the power supply switching circuit 60 may interface with the auxiliary signal interface of the auxiliary circuitry 32B via one or more power supply signals 74. As an example, the power supply switching circuit 60 may generate one or more supply voltages. The one or more supply voltages may be provided to the second RF amplifier 24A as the power supply signals 74. In some embodiments, the power supply signals 74 may include control signals, feedback signals, feed-forward signals, and/or a combination thereof from the second RF amplifier 24A.

As an operational example, the control circuitry 66 may receive control information from the controller 26. Based on the control information received from the controller 26, the control circuitry 66 may configure the operation of the first RF amplifier circuit 30 via the first RF amplifier control signals 70. Similarly, the control circuitry 66 may configure the operation of the power supply switching circuit 60 via the power supply control signals 68. In addition, the control circuitry 66 may configure the operation of the second RF amplifier 24A via the auxiliary signals 46A as a function of the control information. Likewise, in some embodiments, the control circuitry 66 may govern control of the RF switch circuitry 28A via the auxiliary signals 46A.

As an example, in some embodiments, the control circuitry 66 may provide the second control signals 42 as control signal(s) via the auxiliary signals 46A. As another example, in some embodiments, the control circuitry 66 may be configured to provide the RF switch control signals 44 to the RF switch circuitry 28A via the auxiliary signals 46A.

Figure 4:
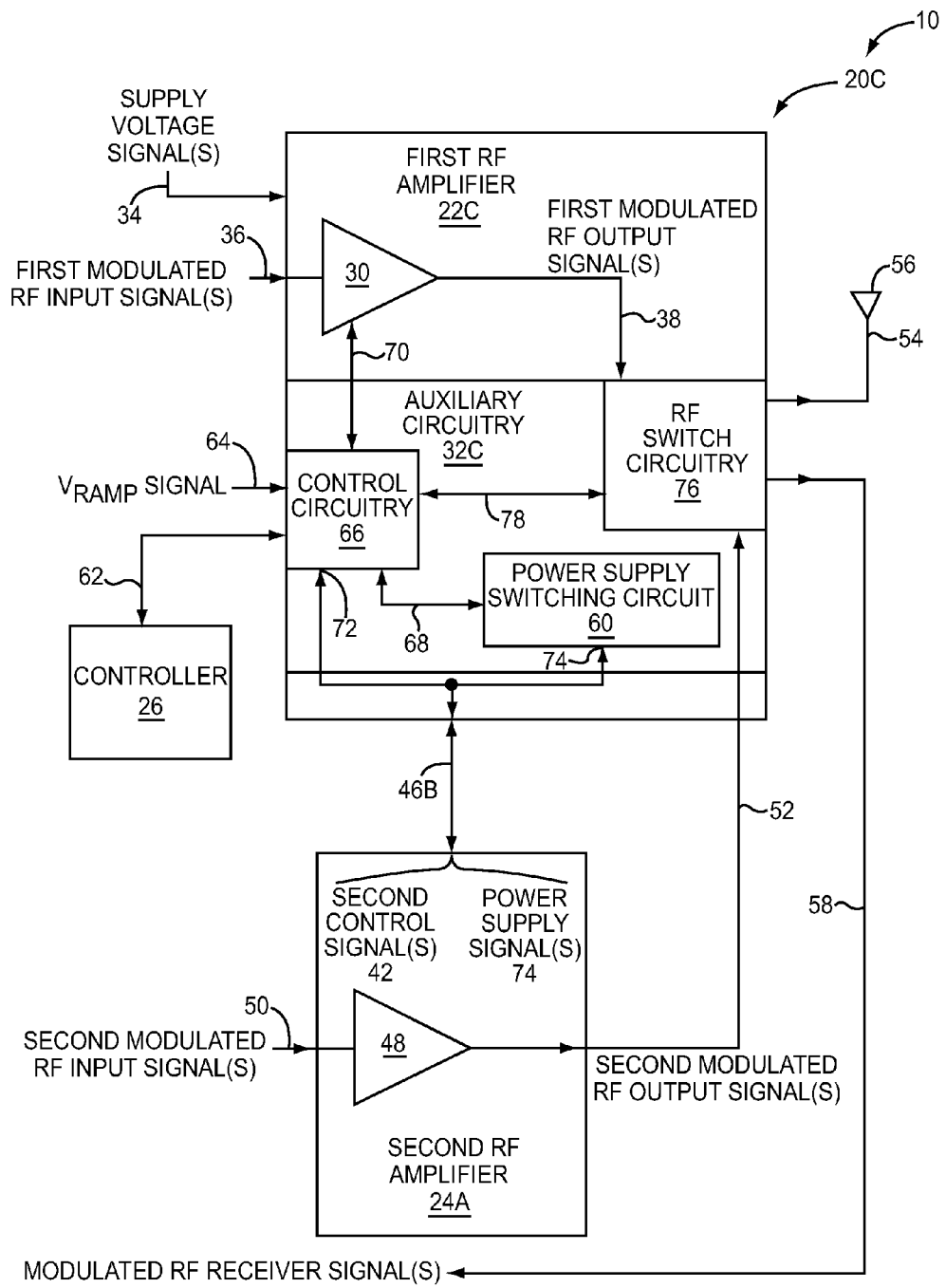
FIG. 4 illustrates another embodiment of the communication device or mobile terminal that includes an example of a multimode RF amplifier system having an auxiliary circuit that includes control circuitry, a power supply switching circuit, and RF switch circuitry.

FIG. 4 depicts another embodiment of the electronic device 10 having an embodiment of a multimode RF amplifier system 20C. The multimode RF amplifier system 20C may include an embodiment of the first RF amplifier 22C that is similar to the first RF amplifier 22B depicted in FIG. 3. However, as depicted in FIG. 4, auxiliary circuitry 32C may further include some portions of the RF switch circuitry 28A depicted in FIG. 3.

As an example, the first RF amplifier 22C may further include RF switch circuitry 76 that is similar to the RF switch circuitry 28 and 28A, depicted in FIGS. 1-3. In addition, the control circuitry 66 may be further configured to govern the operation of the RF switch circuitry 76 via one or more switch control signals 78. In some embodiments, the switch control signals 78 may be similar to the RF switch control signals 44, which are described above with respect to FIG. 1. The auxiliary circuitry 32C may be in communication with the second RF amplifier 24A via auxiliary signals 46B. The auxiliary signals 46B may include the auxiliary control signals 72 and one or more power supply signals 74. The controller 26 may govern the operation of the second RF amplifier 24A via the auxiliary signals 46B. For example, the auxiliary signals 46B may include control signals and power supply signals. As an example, the control circuitry 66 may receive a control parameter or a command from the controller 26 via the control bus 62. The control parameter or the command may instruct the control circuitry 66 to govern the operation of the second RF amplifier 24A via the auxiliary signals 46B. Alternatively, the control parameter or the command may instruct the control circuitry 66 to govern the operation of the power supply switching circuit 60 via the one or more power supply control signals 68.

As an example, the control circuitry 66 may configure the power supply switching circuit 60 to provide one or more supply voltages to the second RF amplifier circuit 48 based on the control parameter or the command. For example, the control circuitry 66 may configure the power supply switching circuit 60 to generate a supply voltage that is a modulated supply voltage, which substantially tracks an envelope of a second modulated RF input signal 50 to be provided to the second RF amplifier circuit 48 for transmission. As another example, the control circuitry 66 may configure the power supply switching circuit 60 to provide a supply voltage based on a power mode of operation of the second RF amplifier circuit 48. For example, the power supply switching circuit 60 may operate in a high power mode, a medium power mode, and/or a low power mode based on an expected output power of a data transmission to be sent. The auxiliary signals 46B may include a control signal to configure the operation of the second RF amplifier circuit 48. Similarly, the auxiliary control signals 72 may include feedback signals or control signals provided by the second RF amplifier 24A. The RF switch circuitry 76 uses the switch control signals 78. In addition, the first RF amplifier 22C may receive the one or more second modulated RF output signals 52 from the second RF amplifier 24A. The second modulated RF output signals 52 may be provided to the RF switch circuitry 76. The RF switch circuitry 76 may provide the one or more modulated RF receiver signals 58 as an output to a digital baseband circuit or a digital modem circuit of the electronic device 10.

Figure 5:
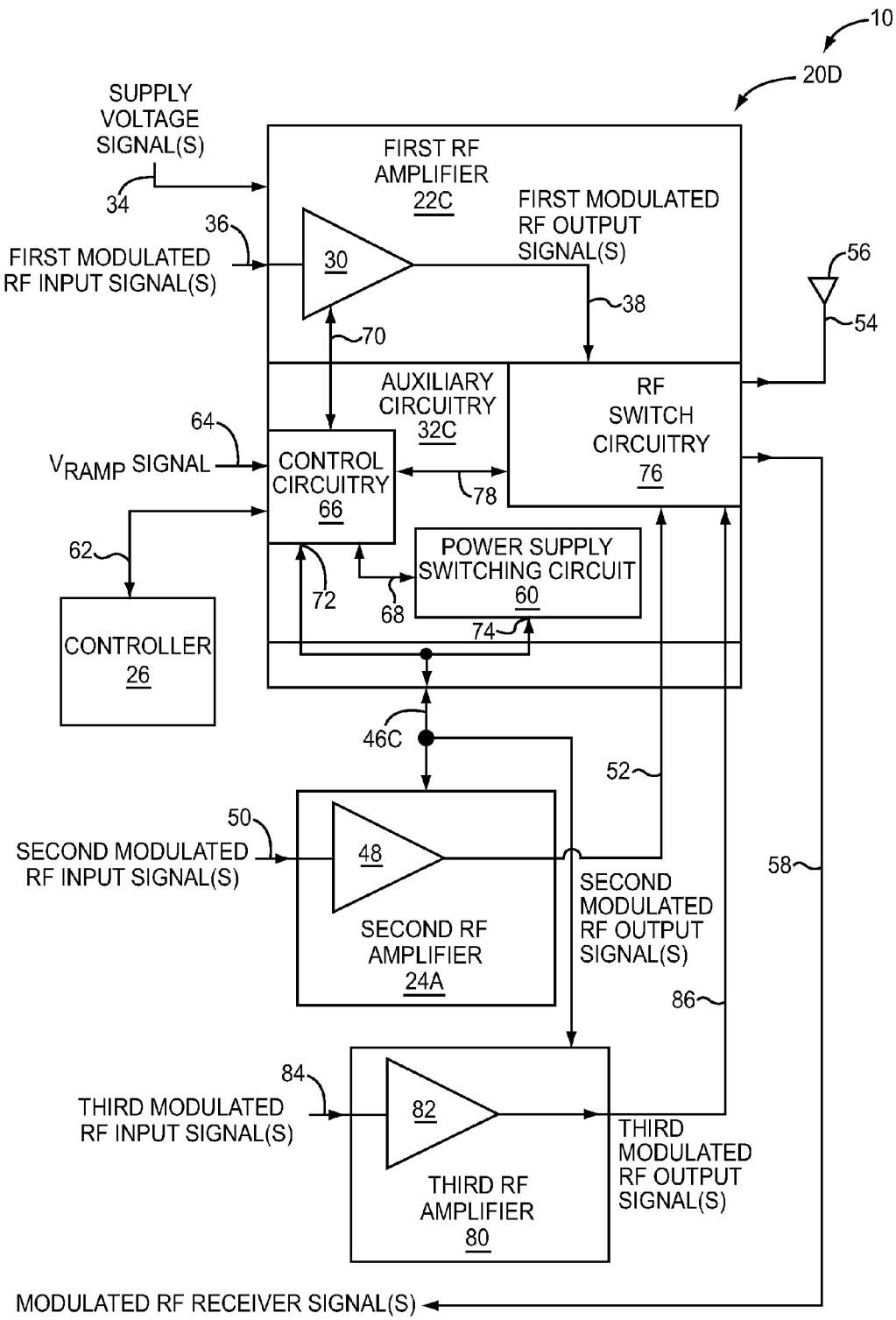
FIG. 5 illustrates another embodiment of the communication device or mobile terminal that includes an example of a multimode RF amplifier system having a first RF amplifier, a second RF amplifier, and a third RF amplifier.

FIG. 5 depicts another embodiment of the electronic device 10 including another embodiment of a multimode RF amplifier system 20D that has the second RF amplifier 24A and a third RF amplifier 80. The third RF amplifier 80 may include a third RF amplifier circuit 82 configured to receive one or more third modulated RF input signals 84. The third RF amplifier circuit 82 may be configured to support one or more RF communication standards, one or more operational modes of an RF communication standard, one or more frequency bands associated with an RF communication standard, and/or a combination thereof. The third RF amplifier circuit 82 may be configured to generate one or more third modulated RF output signal(s) 86 based on the third modulated RF input signal(s) 84, as described below. The second RF amplifier 24A and the third RF amplifier 80 may be in communication with the first RF amplifier 22C via auxiliary signals 46C. The auxiliary signals 46C are similar to the auxiliary signals 46B provided to the second RF amplifier 24A and the second RF amplifier circuit 48 in the embodiment described with respect to FIG. 4. The auxiliary signals 46C may further include additional control signals and power supply signals to support the operation of the third RF amplifier 80. In some embodiments, some of the auxiliary signals 46C may be shared between the second RF amplifier 24A and the third RF amplifier 80. For example, in some embodiments, the auxiliary signals 46C may include supply voltages that may be shared by the second RF amplifier circuit 48 and the third RF amplifier circuit 82. In some embodiments, the control circuitry 66 may enable and disable the second RF amplifier circuit 48 and the third RF amplifier circuit 82 to ensure mutually exclusive operation.

The third RF amplifier circuit 82 may generate a respective one of one or more of the third modulated RF output signals 86 in response to receipt of a respective one of the third modulated RF input signals 84. The third RF amplifier 80 may provide the respective one of the third modulated RF output signals 86 to the RF switch circuitry 76.

The controller 26 may configure the auxiliary circuitry 32C to provide a service or a utility to the third RF amplifier 80 based on a mode of operation of the electronic device 10. For example, the service or the utility may include providing a supply voltage to enable operation of the third RF amplifier circuit 82. Alternatively, the service or the utility may be to provide control functions via the control circuitry 66. As an example, the controller 26 may configure the operation of the third RF amplifier circuit 82 via the control bus 62 even though the third RF amplifier 80 does not include circuitry to interface with the controller 26 via the control bus 62. As yet another service or utility, the auxiliary circuitry 32C may switchably couple the third RF amplifier 80 to the antenna 56 in order to transmit a respective one of the third modulated RF output signals 86 and provide a respective one of the modulated RF receiver signals 58 associated with the third modulated RF output signals 86 to the electronic device 10.

In some embodiments, the RF switch circuitry 76 may include filter circuitry associated with the third modulated RF output signals 86. As an example, the RF switch circuitry 76 may include a duplexer for each of the third modulated RF output signals 86. The controller 26 may instruct the control circuitry 66 to configure the RF switch circuitry 76 to switchably couple the antenna port of the RF switch circuit to a switch port that receives the respective one of the third modulated RF output signals 86 generated by the third RF amplifier circuit 82. The duplexer circuit may provide a respective one of the modulated RF receiver signals 58 that is associated with the one of the third modulated RF output signals 86 generated by the third RF amplifier circuit 82. In other embodiments, the third RF amplifier 80 may include the filter circuitry associated with the third RF amplifier circuit 82.

Similar to the control of the second RF amplifier 24A, the controller 26 may configure the operation of the third RF amplifier 80 via the control bus 62 and/or the $V_{RAMP}$ signal 64. The controller 26 may configure the control circuitry 66 to generate various control signals or provide control settings and/or parameters via the auxiliary signals 46C to the third RF amplifier 80. In addition, the controller 26 may configure the power supply switching circuit 60 to generate one or more supply voltages for use by the third RF amplifier 80.

As an example, in some embodiments, the first RF amplifier circuit 30, the second RF amplifier circuit 48, and the third RF amplifier circuit 82 may each support a different RF communication standard or mode of operation within a communication network.

The electronic device 10 may selectively enable one of the first RF amplifier circuit 30, the second RF amplifier circuit 48, and the third RF amplifier circuit 82 based on a selection of a desired band of transmission, data rate, and/or application. For example, the second RF amplifier 24A may support a 3G standard while the third RF amplifier may support a 4G LTE standard. In other embodiments, the second RF amplifier 24A may support a first frequency band of a transmission standard or communication network standard, and the third RF amplifier 80 may support a second frequency band of the transmission standard or communication network standard.

In some embodiments, the second RF amplifier 24A may be packaged in an electronic package without the third RF amplifier 80. Alternatively, second RF amplifier circuit 48 may be packaged in an electronic package without the third RF amplifier circuit 82. In other embodiments, the second RF amplifier circuit 48 and the third RF amplifier circuit 82 may be packaged in the same electronic package. In addition, the first RF amplifier circuit 30 may be disabled or cease to generate a respective one of the first modulated RF output signals 38 (FIGS. 1-3) when either the second RF amplifier circuit 48 or the third RF amplifier circuit 82 is enabled to transmit.

Figure 6:
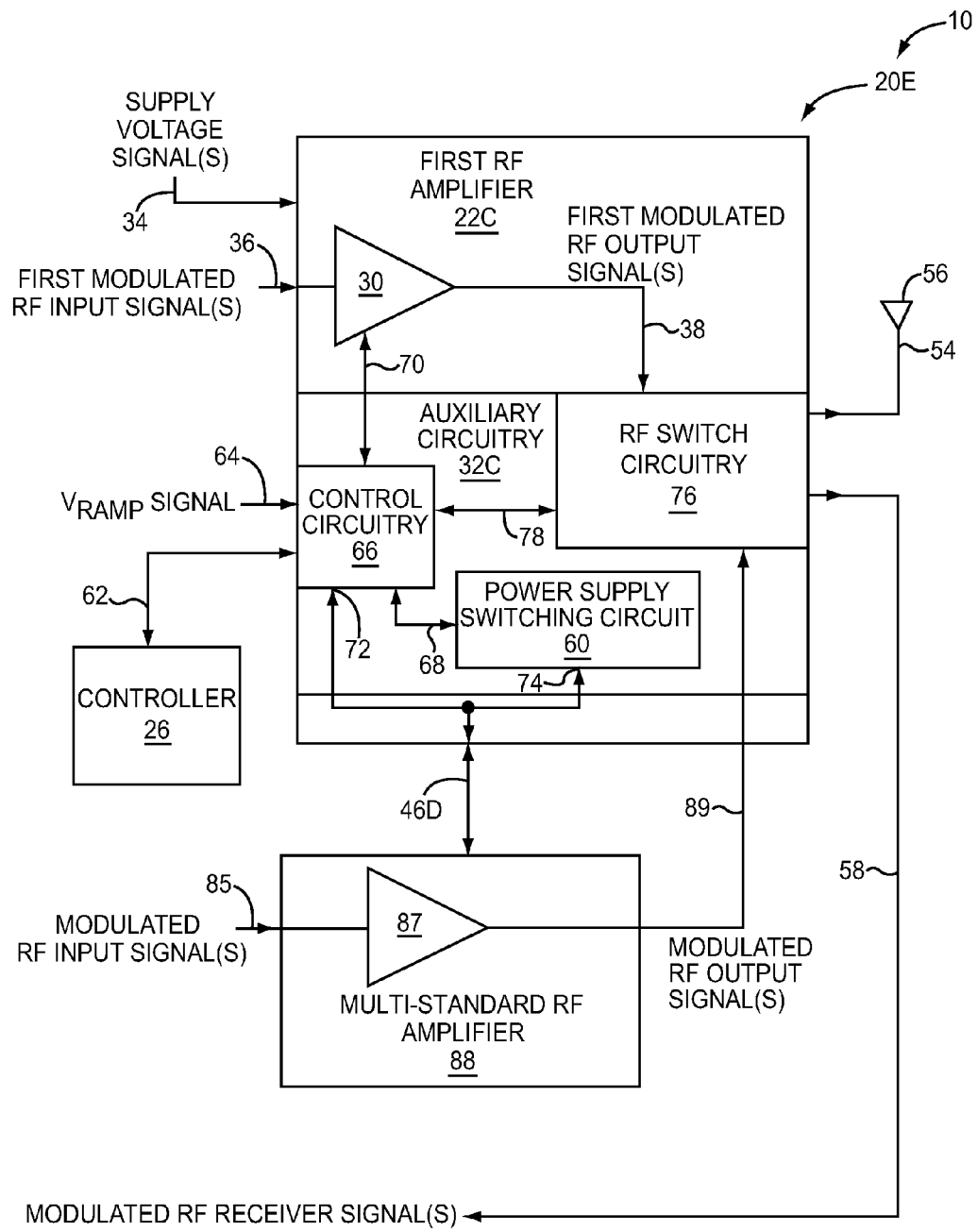
FIG. 6 illustrates another embodiment of the communication device or mobile terminal that includes an example of a multimode RF amplifier system having a first RF amplifier and a multi-standard RF amplifier.

FIG. 6 depicts another embodiment of the electronic device 10 that includes a multimode RF amplifier system 20E. The multimode RF amplifier system 20E may be similar to the multimode RF amplifier system 20C (FIG. 4), except that the second RF amplifier 24A is replaced by multi-standard RF amplifier 88 that includes a multi-standard RF amplifier circuit 87 in communication with the first RF amplifier 22C via auxiliary signals 46D. The auxiliary signals 46D may include control signals and power supply signals generated or received by the control circuitry 66 and the power supply switching circuit 60. The auxiliary signals 46D may permit the control circuitry 66 to enable and control the operation of the multi-standard RF amplifier 88 and the multi-standard RF amplifier circuit 87 based on control parameters and commands received from the controller 26. In addition, the auxiliary signals 46D include control signals, feedback signals, feed-forward control signals, power supply signals, supply voltages, data signals, analog signals, and digital data signals. In some embodiments, the supply voltages may include supply voltages for various portions of the multi-standard RF amplifier circuit 87. As an example, the multi-standard RF amplifier circuit 87 may include logic circuitry, bias circuitry, driver stage circuitry, and output stage circuitry. The logic circuitry may be configured to govern the operation of the various portions of the multi-standard RF amplifier circuit 87. The bias circuitry may be configured to bias various portions of the multi-standard RF amplifier circuit 87 or to selectively provide supply voltages to the various portions of the multi-standard RF amplifier circuit 87. The driver stage circuitry may be configured to receive one or more modulated RF input signals 85. For example, the driver stage circuitry may act as a pre-amplifier. The output stage circuitry may be configured to receive an output from the driver stage circuitry and generate the one or more modulated RF output signals 89. In some embodiments, the auxiliary signals 46D may include a logic circuitry supply voltage, a driver stage circuitry supply voltage, a bias circuitry supply voltage, an output stage circuitry supply voltage, and/or a combination thereof. Although described with respect to an embodiment of the multi-standard RF amplifier circuit 87, this is by way of example and not by limitation. Thus, the description of the auxiliary signals 46D may be applicable to the various other embodiments described in FIGS. 1-5.

The multi-standard RF amplifier circuit 87 may be configured to receive the one or more modulated RF input signals 85. The multi-standard RF amplifier circuit 87 may generate a respective one of the one or more modulated RF output signals 89. In some embodiments, the electronic device 10 may include a digital baseband circuit or digital modem circuit configured to provide a respective one of the modulated RF input signals 85 to the multi-standard RF amplifier circuit 87 based on a selection of an RF communication standard to use within a communication network. In some embodiments, the digital baseband circuit or digital modem circuit may be configured to generate different modulated RF input signals 85. In some embodiments, the digital baseband circuit or digital modem circuit may provide the modulated RF input signals 85 via a single transmission path.

The multi-standard RF amplifier circuit 87 may be configured to support one or more RF communication standards. For example, the multi-standard RF amplifier circuit 87 may be configured to receive modulated RF input signals 85 that are specified in both a 3G standard and a 4G LTE standard. In some embodiments, the multi-standard RF amplifier 88 may be configured to cooperatively operate with the multi-standard RF amplifier circuit 87 to supply one or more frequency bands associated with an RF communication standard. For example, the multi-standard RF amplifier circuit 87 may be configured to support a first frequency band, a second frequency band, and a third frequency band. A non-limiting list of example frequency bands may include UMTS Terrestrial Radio Access (UTRA) frequency bands, Time Division Duplex (TDD) frequency bands, and Frequency Division Duplex (FDD) frequency bands. Further examples may include frequency bands associated with the various embodiments of the one or more 3G standards and/or one or more of the embodiments of the 4G LTE standards.

The auxiliary circuitry 32C may provide various services and/or utilities to the multi-standard RF amplifier 88 and/or multi-standard RF amplifier circuit 87 as a function of the RF communication standard to be used. As an example, in some embodiments, the controller 26 may configure the operation of the multi-standard RF amplifier 88 and/or the multi-standard RF amplifier circuit 87 via the auxiliary signals 46D. The controller 26 may configure the multi-standard RF amplifier circuit 87 to generate a respective one of the modulated RF output signals 89 as a function of a respective one of the modulated RF input signals 85.

As described herein, the embodiments may be manufactured based on a fabrication process for GaAs, GaAs MESFET, InGaP, GaN, SiGe, SiGe Bipolar Complementary Metal-Oxide Silicon (Bi-CMOS), SiGe bipolar, Ge, GaAs HBT, pHEMT, InGaAs HEMT, GaAs pHEMT, CMOS, CMOS HEMT, Nitride HEMT, and/or some combination thereof. In some embodiments, the fabrication process may include a GaAs bipolar or MOS process. Still other fabrication processes may include GaAs in combination with Beryllium, Germanium, Nitrogen, Aluminum, Indium, and/or a combination thereof.

In some embodiments, the circuits and modules of the electronic device 10 may be implemented in a desired semiconductor process. For example, in some embodiments, a CMOS process may be used to fabricate a die that includes the control circuitry 66. A different fabrication process may be used to fabricate a die that includes an embodiment of the first RF amplifier circuit 30. Still another fabrication process may be used to fabricate a die that includes the second RF amplifier circuit 48.

In some embodiments, the multimode RF amplifier system 20E may include two or more integrated chip packages or dies that are interconnected via a module board, a laminate, a laminated printed circuit board, a circuit board, a substrate, a ceramic substrate, and/or a combination thereof. As an example, the multimode RF amplifier system 20E may include an electronic module board configured to receive a first integrated circuit and a second integrated circuit. The first integrated circuit may be a first die and the second integrated circuit may be a second die. The first integrated circuit may include the first RF amplifier circuit 30. The second integrated circuit may include a portion of an embodiment of the auxiliary circuitry 32C. As another example, the second integrated circuit may include an RF switch circuit.

As an example, in some embodiments of the multimode RF amplifier system 20E, a 2G GSM RF amplifier may include an auxiliary circuit 32C configured to provided a utility or a service to one or more non-2G GSM RF amplifiers. As an example, the 2G GSM RF amplifier and the auxiliary circuit may be located in a first electronic package or electronic module. A non-2G GSM RF amplifier that uses the utility or the service provided by the auxiliary circuit may be in a second electronic package or electronic module.

In some embodiments, the multimode RF amplifier system 20E may include various forms of electronic packages and/or electronic modules. As an example, some embodiments of the multimode RF amplifier system 20E may include first RF amplifier 22C having a first integrated circuit and a second integrated circuit mounted on an electronic module board. The first integrated circuit may be a first semiconductor die and the second integrated circuit may be a second semiconductor die. The first semiconductor die may include the first RF amplifier circuit 30. The second semiconductor die may include a portion of the auxiliary circuitry 32C. As an example, the second semiconductor die may include a portion of the power supply switching circuit 60. In some embodiments, the second semiconductor die may include a portion of the control circuitry 66. In some embodiments, the multimode RF amplifier system 20E may further include a third semiconductor die. For example, the third semiconductor die may include a portion of the RF switch circuitry 76. In some embodiments, the second semiconductor die may further include a portion of the RF switch circuitry 76. The multimode RF amplifier system 20E may be in a first electronic package.

As an example, the multimode RF amplifier system 20E may include a pin grid array (PGA), a leadless chip carrier (LCC), a small-outline integrated circuit (SOIC), a plastic leaded chip carrier (PLCC), a plastic quad flat pack (PQFP), a land grid array (LGA), a ball grid array (BGA), a flip-chip ball grid array (FCBGA), a system in package (SiP), and/or a multi-chip module (MCM). In some embodiments, an electronic package or electronic module includes multiple dies, a wafer board, a flip chip, a sing die in a package or a module, a wafer-level chip scale package (WL-CSP), and/or some combination thereof.

An example non-2G GSM RF amplifier may include a 3G RF amplifier or a 4G LTE RF amplifier. As an example, the auxiliary circuit may include a switching circuit configured to provide a supply voltage to the one or more non-2G GSM RF amplifiers. The utility or the service provided by the auxiliary circuit to the one or more non-2G GSM RF amplifiers may be unused by the 2G GSM RF amplifiers. Advantageously, the operation of the 2G GSM RF amplifiers may be unaffected by operation of the switching circuit because operation of the 2G GSM RF amplifiers and the one or more non-2G GSM RF amplifiers may be mutually exclusive.

In addition, placing the one or more non-2G GSM RF amplifiers in a separate package or module from the switching circuit may isolate the one or more non-2G GSM RF amplifiers from the fundamental and harmonic frequencies generated by the switching circuit. As a result, the one or more non-2G GSM RF amplifiers may be less likely to become victim circuits of signals emitted or generated by the switching circuit. In some embodiments, the auxiliary circuit packaged with the 2G GSM RF amplifiers may further provide a utility or a service to both the 2G GSM RF amplifiers and the non-2G GSM RF amplifiers.

As an alternative example of the multimode RF amplifier system 20E, the auxiliary circuit may be located in the package of the 2G GSM RF amplifiers. The auxiliary circuit may include the control circuitry 66. The control circuitry 66 may include a control bus configured to interface with a master device, a controller, or a processor. The 2G GSM RF amplifiers may be controlled via the control circuitry. The 2G GSM RF amplifiers may include one or more interfaces to control the one or more non-2G GSM RF amplifiers. As another example, the auxiliary circuit may further include an RF switch circuit. The RF switch circuit may include a first RF interface configured to receive a 2G RF amplifier output signal. For example, a 2G GSM RF amplifier output signal may be a 2G GSM low band transmit signal or a 2G GSM high band transmit signal. The RF switch circuit may include one or more RF interfaces configured to receive a non-2G GSM RF amplifier output signal from the one or more non-2G GSM RF amplifiers.

According to embodiments disclosed herein, the multimode RF amplifier system 20E may be provided in or integrated into any communication device, mobile terminal, and/or computing-based device. Examples, without limitation, may include a set top box, a digital set top box, an entertainment unit, a navigation device, a communications device, a fixed location data unit, a mobile location data unit, a cellular phone, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a mobile terminal, a security system, a sensor system, and a portable digital video player.

Those of skill in the art will further appreciate that the various illustrative logical blocks, modules, circuits, services, utilities, and algorithms described in connection with the embodiments disclosed herein may be implemented as electronic hardware, instructions stored in memory or in another computer-readable medium and executed by a processor or other processing device, or a combination of both. The arbiters, master devices, and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, utilities, services, and functions have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a processor, a digital signal processor (DSP), an Application Specific Integrated Circuit (ASIC), an FPGA or other programmable logic device, discrete gate or transistor logic, discrete hardware components, or any combination thereof designed to perform the functions described herein. A processor may be a microprocessor, but in the alternative, the processor may be any conventional processor, a controller, a control unit, a microcontroller, or a state machine. A processor may also be implemented as a combination of computing devices. As a non-limiting example, computing devices may include a combination of a DSP, a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium may be coupled to the processor such that the processor or the controller may read information from, and write information to, the storage medium. In the alternative, the storage medium may be integral to the processor.

Figure 7:
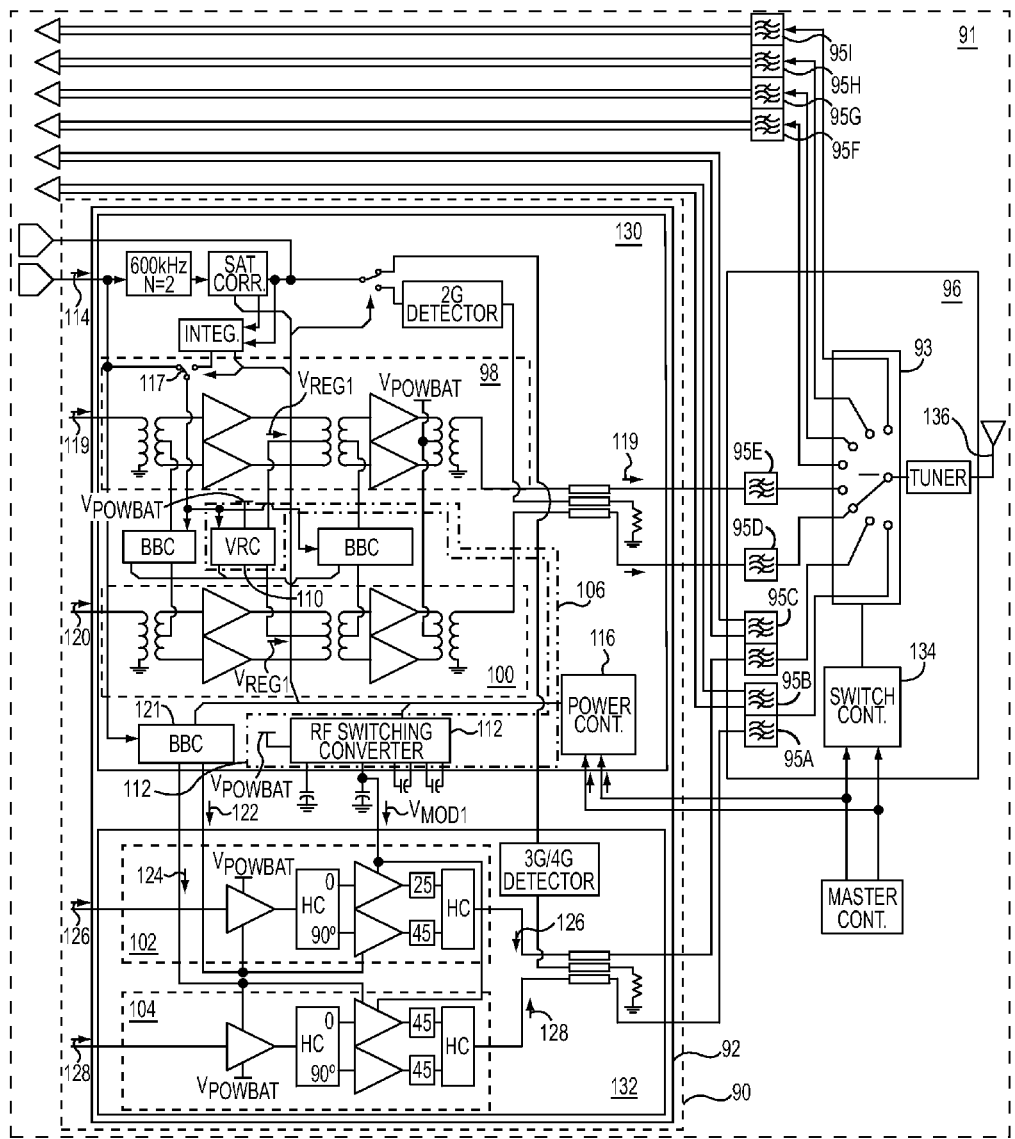
FIG. 7 illustrates an exemplary RF module that includes one embodiment of an RF amplification device formed on a single semiconductor die.

FIG. 7 illustrates an exemplary RF module 91. The RF module 91 is an integrated circuit (IC) package assembly mounted on an IC package (not shown). The RF module 91 includes one embodiment of an RF amplification device 90 formed on a semiconductor die 92. The semiconductor die 92 may be a Silicon Germanium-type semiconductor die. Additionally, the RF module 91 includes a Single-Pole Multi Throw (SPMT) switch 93 formed on a semiconductor die 96, and a plurality of RF filters (referred to generically as elements 95, and specifically as elements 95A-95I). The RF amplification device 90 includes a first RF amplification circuit 98, a second RF amplification circuit 100, a third RF amplification circuit 102, and a fourth RF amplification circuit 104. Each RF amplification circuit 98, 100, 102, 104 is formed on the semiconductor die 92.

An RF power converter 106 is also formed on the semiconductor die 92. The RF power converter 106 is configured to generate a regulated supply voltage $V_{REG1}$ from a power source voltage $V_{POWBAT}$, such as a battery voltage from a battery or a rectified DC voltage from an external AC-to-DC converter. The RF power converter 106 is also configured to generate a modulated supply voltage $V_{MOD1}$ from the power source voltage $V_{POWBAT}$. In this particular embodiment, the RF power converter 106 includes a voltage regulation circuit (VRC) 110 formed on the semiconductor die 92 and an RF switching converter 112 formed on the semiconductor die 92.

The VRC 110 is configured to generate the regulated supply voltage, $V_{REG1}$ from the power source voltage $V_{POWBAT}$. For example, the VRC 110 may be a low-dropout (LDO) regulation circuit. So long as the VRC 110 is not saturated, the VRC 110 can provide the regulated supply voltage $V_{REG1}$ so that the regulated supply voltage $V_{REG1}$ has a regulated voltage level. Accordingly, the regulated voltage level of the regulated supply voltage $V_{REG1}$ is provided steadily despite glitches and sudden changes in the power source voltage $V_{POWBAT}$. The VRC 110 sets the regulated voltage level of the regulated supply voltage $V_{REG1}$ at a desired regulated voltage level. The VRC 110 receives a supply voltage control signal 114, which, in this example, is a voltage. The VRC 110 is configured to set the regulated supply voltage $V_{REG1}$ in accordance with a supply voltage control signal level of the supply voltage control signal 114. For instance, the VRC 110 may include feedback circuitry and/or the like in order to drive the regulated supply voltage $V_{REG1}$ to the regulated voltage level indicated by the supply voltage control signal level of the supply voltage control signal 114.

A power controller 116 is formed on the semiconductor die 92. The power controller 116 is configured to enable and disable the VRC 110. The power controller 116 is also configured to enable and disable the RF switching converter 112. Additionally, the power controller 116 is configured to set the VRC 110 so that the regulated supply voltage $V_{REG1}$ is configured to enable and disable the first RF amplification circuit 98 and the second RF amplification circuit 100. To enable the first RF amplification circuit 98, the power controller 116 sets the VRC 110 so that the regulated supply voltage $V_{REG1}$ is provided to the first RF amplification circuit 98. Furthermore, the power controller 116 operates an SPMT switch 117 so that the supply voltage control signal 114 is provided to the VRC 110. Finally, the RF switching converter 112 is disabled.

To enable the second RF amplification circuit 100, the power controller 116 sets the VRC 110 so that the regulated supply voltage $V_{REG1}$ is provided to the second RF amplification circuit 100. Furthermore, the power controller 116 operates the SPMT switch 117 so that the supply voltage control signal 114 is provided to the VRC 110. Finally, the RF switching converter 112 is disabled.

As shown in FIG. 7, the first RF amplification circuit 98 is configured amplify a first RF signal 119 using the regulated supply voltage $V_{REG1}$ from the VRC 110. In this embodiment, the first RF signal 119 is formatted in accordance with a 2G GSM standard and, more specifically, may be formatted in accordance with a GSM-850 specification or a GSM-900 specification. Both the GSM-850 specification and the GSM-900 specification employ Time Division Multiple Access (TDMA) multiplexing. The second RF amplification circuit 100 is configured to amplify a second RF signal 120 using the regulated supply voltage $V_{REG1}$ from the VRC 110. In this embodiment, the first RF signal 119 is formatted in accordance with the 2G GSM standard and, more specifically, may be formatted in accordance with a Digital Communication System (DCS) specification or a Personal Communications Service (PCS) specification. Both the DCS specification and the PCS specification employ TDMA multiplexing. However, the DCS specification and the PCS specification are provided with frequency bands that are higher than frequency bands for the GSM-850 specification and the GSM-900 specification. As such, the first RF amplification circuit 98 may be considered a low band 2G GSM amplification circuit, while the second RF amplification circuit 100 may be considered a high band 2G GSM amplification circuit.

The first RF amplification circuit 98 and the second RF amplification circuit 100 are each operably associated with the VRC 110 such that an amplification gain of the first RF amplification circuit 98 and an amplification gain of the second RF amplification circuit 100 are set by the regulated voltage level. In other words, as the regulated voltage level of the regulated supply voltage $V_{REG1}$ varies, so do the amplification gains of the first RF amplification circuit 98 and the second RF amplification circuit 100. This allows both the first RF signal 119 and the second RF signal 120 to comply with burst mask requirements for a given timeslot. When the VRC 110 is enabled, the supply voltage control signal level of the supply voltage control signal 114 ramps up and ramps down from a maximum value. The amplification gain of the first RF amplification circuit 98 and the second RF amplification circuit 100 are thus adjusted so that the first RF signal 119 and the second RF signal 120 comply with a burst mask specified for a timeslot.

Referring again to FIG. 7, the third RF amplification circuit 102 is coupled to the RF power converter 106 so as to receive the modulated supply voltage $V_{MOD1}$. In addition, a base current circuit (BBC) 121 is coupled to provide the quiescent operating current 122. When the third RF amplification circuit 102 is disabled, the quiescent operating current 122 is not provided to the third RF amplification circuit 102. To enable the third RF amplification circuit 102, the power controller 116 operates the base current circuit 121, so that the quiescent operating current 122 is provided to the third RF amplification circuit 102. Furthermore, the power controller 116 enables the RF switching converter 112 and operates the SPMT switch 117 so that the supply voltage control signal 114 is provided to the base current circuit 121. The VRC 110 is also disabled. The third RF amplification circuit 102 is configured to amplify a third RF signal 126 using the modulated supply voltage $V_{MOD1}$ from the RF switching converter 112.

The fourth RF amplification circuit 104 is also coupled to the RF power converter 106 so as to receive the modulated supply voltage $V_{MOD1}$. In addition, the base current circuit 121 is coupled to provide a quiescent operating current 124. When the fourth RF amplification circuit 104 is disabled, the quiescent operating current 124 is not provided to the fourth RF amplification circuit 104. To enable the fourth RF amplification circuit 104, the power controller 116 operates the base current circuit 121, so that the quiescent operating current 124 is provided to the fourth RF amplification circuit 104. Furthermore, the power controller 116 enables the RF switching converter 112 and operates the SPMT switch 117 so that the supply voltage control signal 114 is provided to the base current circuit 121. Finally, the VRC 110 is disabled. The fourth RF amplification circuit 104 is configured to amplify a fourth RF signal 128 using the modulated supply voltage $V_{MOD1}$ from the RF switching converter 112.

The third RF signal 126 is formatted in accordance with a 3G standard or a 4G LTE standard and, more specifically, may be formatted in accordance with an EDGE-850 specification, an EDGE-950 specification, and other 3G and 4G LTE specifications within lower frequency bands. The fourth RF signal 128 is formatted in accordance with a 3G standard or a 4G LTE standard and, more specifically, may be formatted in accordance with 3G and 4G LTE specifications within higher frequency bands. The specifications defined within the 3G standard and the 4G LTE standard employ either W-CDMA multiplexing or OFDMA multiplexing. With both W-CDMA multiplexing and OFDMA multiplexing, an envelope of the third RF signal 126 and an envelope of the fourth RF signal 128 varies. To provide envelope tracking, the supply voltage control signal level of the supply voltage control signal 114 is varied to adjust the envelopes of the third RF signal 126 and the envelope of the fourth RF signal 128 accordingly. This provides modulation of the modulated supply voltage $V_{MOD1}$.

The RF switching converter 112 has a switching controller, a switching circuit, and an RF filter. The switching circuit is configured to generate a pulsed output voltage from the power source voltage $V_{POWBAT}$. Thus, the switching circuit may include one or more switches, such as switchable transistors, that can be turned on and turned off to present the pulsed output voltage in at least two different voltage states. In this manner, the switching circuit produces the pulses in the pulsed output voltage. The RF filter is configured to convert the pulsed output voltage from the switching circuit into the modulated supply voltage $V_{MOD1}$.

Due to high frequency switching, the RF switching converter 112 may produce a high level of spurious emissions. Without protective measures, these spurious emissions may propagate through the semiconductor die 92 and pollute the output spectrum of the third RF signal 126 and the fourth RF signal 128. To ameliorate or eliminate these effects, the third RF amplification circuit 102 and the fourth RF amplification circuit 104 are both formed on the semiconductor die 92 such that both are electromagnetically isolated from the RF power converter 106 and, in particular, from the RF switching converter 112. As such, the third RF amplification circuit 102 and the fourth RF amplification circuit 104 are protected from spurious emissions generated by the RF power converter 106.

In one example, the electromagnetic isolation is such that the spurious emissions do not reach the third RF amplification circuit 102 and the fourth RF amplification circuit 104. In another example, the electromagnetic isolation is such that the spurious emissions are sufficiently attenuated at the third RF amplification circuit 102 and the fourth RF amplification circuit 104 such that the third RF amplification circuit 102 and the fourth RF amplification circuit 104 comply with design margins and spectral requirements (barring aberrant or sporadic electromagnetic emission anomalies). While the third RF amplification circuit 102 and the fourth RF amplification circuit 104 are each coupled to the RF switching converter 112 so as to receive the modulated supply voltage $V_{MOD1}$, the electromagnetic isolation protects the third RF amplification circuit 102 and the fourth RF amplification circuit 104 from electromagnetic interference.

However, as shown in FIG. 7, the first RF amplification circuit 98 and the second RF amplification circuit 100 are not electromagnetically isolated from the RF power converter 106, and in particular, from the RF switching converter 112. Nevertheless, as discussed above, the power controller 116 disables the RF switching converter 112 while either the first RF amplification circuit 98 or the second RF amplification circuit 100 is enabled. As such, the RF switching converter 112 does not produce spurious emissions (or at least not significant levels of spurious emissions) when the first RF amplification circuit 98 and the second RF amplification circuit 100 are enabled. Thus, this embodiment allows for noisy auxiliary circuits, such as the RF switching converter 112, needed by the third RF amplification circuit 102 and the fourth RF amplification circuit 104 to be placed with circuitry that does not need it, such as the first RF amplification circuit 98 and the second RF amplification circuit 100. The RF amplification device 90 thus protects the third RF amplification circuit 102 and the fourth RF amplification circuit 104 from spurious emissions from the RF switching converter 112. Additionally, the RF switching converter 112 does not interfere with the performance of the first RF amplification circuit 98 and the second RF amplification circuit 100 since the RF switching converter 112 is disabled when the first RF amplification circuit 98 and the second RF amplification circuit 100 are enabled.

In this embodiment, a first active region 130 and a second active region 132 are each formed on the semiconductor die 92. The active regions 130, 132 are layered structures in which active semiconductor components are built. The second active region 132 is formed on the semiconductor die 92 such that the first active region 130 and the second active region 132 are electromagnetically isolated. More specifically, the second active region 132 in FIG. 7 is discontinuous with the first active region 130 so as to provide electromagnetic isolation between the first active region 130 and the second active region 132. Also, both the first active region 130 and the second active region 132 are formed with a Bi-CMOS technology. The first RF amplification circuit 98, the second RF amplification circuit 100, and the RF power converter 106 (including the VRC 110 and the RF switching converter 112) are each formed by the first active region 130. However, the third RF amplification circuit 102 and the fourth RF amplification circuit 104 are each formed by the second active region 132. Thus, the electromagnetic isolation between the first active region 130 and the second active region 132 thereby electromagnetically isolates the third RF amplification circuit 102 and the fourth RF amplification circuit 104 from the RF power converter 106, and in particular the RF switching converter 112. Alternatively or additionally, electromagnetic isolation can be provided by through isolation regions, dielectric isolation, electromagnetic shielding, and/or the like.

Referring again to FIG. 7, the semiconductor die 96 may be a Silicon (Si)-type semiconductor die. Furthermore, components on the semiconductor die 96 may be formed through a Si-On-Insulator (SOI) technology. A switch controller 134 is configured to operate the SMPT switch 93 so that either the first RF signal 119, the second RF signal 120, the third RF signal 126, or the fourth RF signal 128 is propagated by an antenna 136. Furthermore, as shown in FIG. 7, the SMPT switch 93 may also receive various RF signals (not shown) from the antenna 136 and may transmit the RF signals to downstream receive circuitry.

Figure 8:
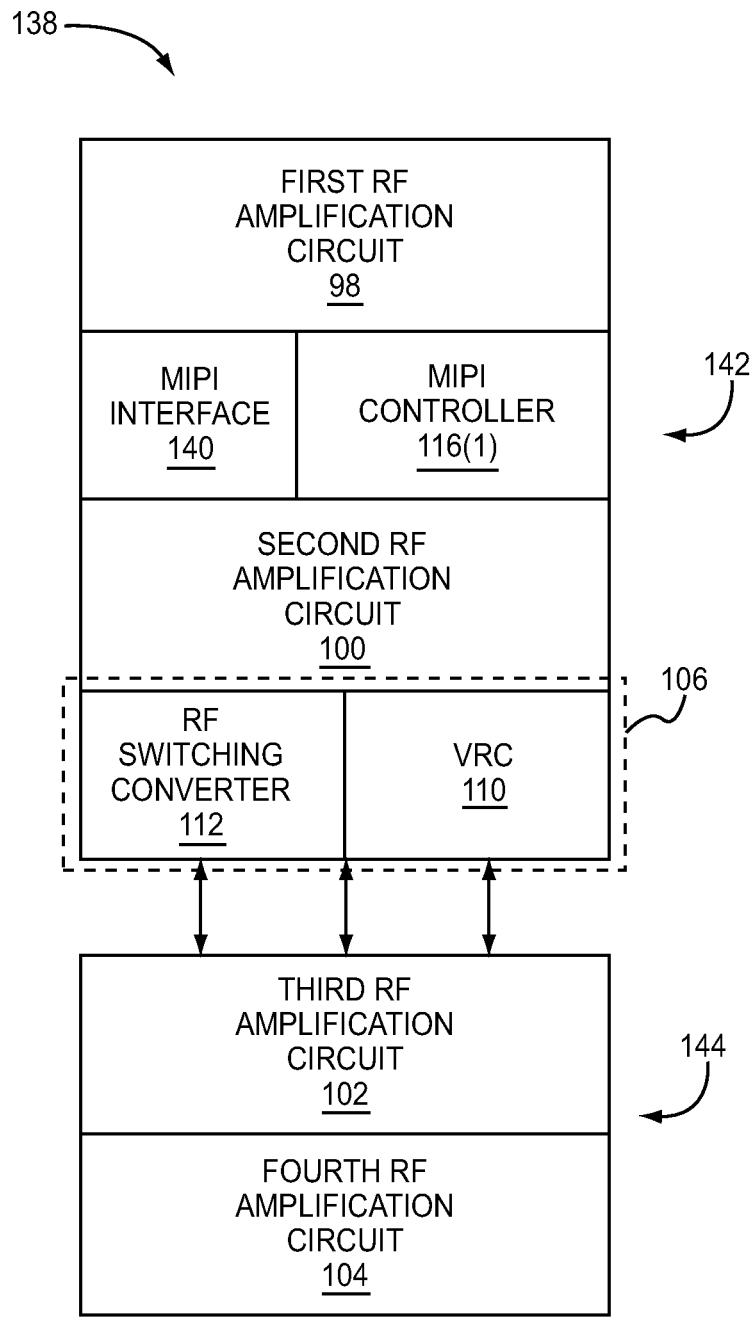
FIG. 8 illustrates another embodiment of an RF amplification device formed on separate semiconductor dice.

FIG. 8 illustrates a block layout of another embodiment of an RF amplification device 138. The RF amplification device 138 described above includes the first RF amplification circuit 98, the second RF amplification circuit 100, the third RF amplification circuit 102, and the fourth RF amplification circuit 104 described above with respect to FIG. 7. Furthermore, the RF amplification device 138 includes one embodiment of the power controller 116, which in this example is a MIPI controller 116(1), as well as a MIPI interface 140. In this embodiment, the first RF amplification circuit 98 and the second RF amplification circuit 100 are formed on a semiconductor die 142. In addition, the RF power converter 106 described above, including the VRC 110 and the RF switching converter 112, is formed on the semiconductor die 142, along with the MIPI controller 116(1) and the MIPI interface 140. In contrast, the third RF amplification circuit 102 and the fourth RF amplification circuit 104 are formed on a semiconductor die 144. As such, the third RF amplification circuit 102 and the fourth RF amplification circuit 104 are both formed on the separate semiconductor die 144 so as to be electromagnetically isolated from the RF power converter 106.

The semiconductor die 142 and the semiconductor die 144 may be mounted either on a single IC package or on separate IC packages. The semiconductor dice 142, 144 may each be a Gallium Arsenide (GaAs)-type die, a Gallium Nitride (GaN)-type die, a Si-type die, a SiGe-type die, and/or the like. Furthermore, the semiconductor die 142 and the semiconductor die 144 do not have to be the same type of semiconductor die. Furthermore, Bi-CMOS technologies, CMOS technologies, or SOI technologies may be used to form semiconductor components on the semiconductor dice 142, 144.

Those skilled in the art will recognize improvements and modifications to the preferred embodiments of the present disclosure. All such improvements and modifications are considered within the scope of the concepts disclosed herein and the claims that follow.

What is claimed is:

1. A multimode radio frequency (RF) amplifier system comprising:
   a first semiconductor die;
   a first RF amplifier formed on the first semiconductor die and including an auxiliary circuit formed on the same first semiconductor die as the first RF amplifier, wherein the first RF amplifier is configured to:
      receive a first modulated RF input signal;
      generate a first modulated RF output signal based on the first modulated RF input signal; and
      provide the first modulated RF output signal for transmission; and
   a second RF amplifier coupled to the auxiliary circuit, wherein the second RF amplifier is configured to receive a second RF input signal and generate a second RF output signal based on the second RF input signal, wherein:
      operation of the first RF amplifier and the auxiliary circuit are mutually exclusive such that:
         when the first RF amplifier is ON, the auxiliary circuit is OFF, and
         when the auxiliary circuit is ON, the first RF amplifier is OFF;
      the second RF amplifier is electromagnetically isolated from the first RF amplifier; and
      the auxiliary circuit is configured to provide a utility to the second RF amplifier.

2. The multimode RF amplifier system of claim 1 wherein the utility provided to the second RF amplifier enables the second RF amplifier to generate the second RF output signal.

3. The multimode RF amplifier system of claim 1 wherein:
   the first RF amplifier includes a transmit enable signal having a transmit enabled state and a transmit disabled state; and
   the auxiliary circuit is further configured to provide the utility to the second RF amplifier only while the transmit enable signal is set to the transmit disabled state.

4. The multimode RF amplifier system of claim 1 wherein the utility provided by the auxiliary circuit to the second RF amplifier comprises:
   generating a supply voltage; and
   providing the supply voltage to the second RF amplifier.

5. The multimode RF amplifier system of claim 4 further comprising a power source voltage input configured to receive a power source voltage; and
   wherein the auxiliary circuit is further configured to boost the power source voltage to generate the supply voltage.

6. The multimode RF amplifier system of claim 4 wherein the auxiliary circuit comprises:
   a power source voltage input configured to receive a power source voltage; and
   a switching network including a first flying capacitor interface configured to communicatively couple the switching network to a first terminal of a first flying capacitor and a second terminal of the first flying capacitor; and
   wherein the auxiliary circuit is further configured to generate the supply voltage as a function of a first flying capacitor voltage developed across the first flying capacitor interface, the switching network, and the power source voltage.

7. The multimode RF amplifier system of claim 6 wherein the switching network further comprises a second flying capacitor interface configured to communicatively couple the switching network to a first terminal of a second flying capacitor and a second terminal of the second flying capacitor; and
   wherein the auxiliary circuit is further configured to generate the supply voltage as a function of the first flying capacitor voltage developed across the first flying capacitor interface, a second flying capacitor voltage developed across the second flying capacitor interface, the switching network, and the power source voltage.

8. The multimode RF amplifier system of claim 4 wherein:
   the supply voltage is a modulated supply voltage; and
   the auxiliary circuit further comprises:
      a power source voltage input configured to receive a power source voltage; and
      a target supply voltage input configured to receive a target supply voltage that substantially tracks an envelope of a modulated RF input signal provided to the second RF amplifier; and
   wherein the auxiliary circuit is further configured to generate the modulated supply voltage as a function of the target supply voltage.

9. The multimode RF amplifier system of claim 8 wherein the target supply voltage is for envelope tracking at least one of a 3G signal and a 4G Long Term Evolution (LTE) signal.

10. The multimode RF amplifier system of claim 4 wherein the auxiliary circuit is further configured to operate as a bang-bang power supply converter configured to generate the supply voltage.

11. The multimode RF amplifier system of claim 4 wherein the auxiliary circuit is further configured to generate the supply voltage to substantially track an envelope of a second modulated RF input signal to be transmitted by the second RF amplifier.

12. The multimode RF amplifier system of claim 4 wherein the auxiliary circuit is configured to operate as a boost power supply converter to generate the supply voltage.

13. The multimode RF amplifier system of claim 4 wherein the auxiliary circuit is further configured to operate as a buck-boost power supply converter to generate the supply voltage.

14. The multimode RF amplifier system of claim 13 wherein the auxiliary circuit is further configured to generate the supply voltage to substantially track an envelope of a modulated RF input signal to be transmitted by the second RF amplifier.

15. The multimode RF amplifier system of claim 1 wherein the auxiliary circuit further comprises an auxiliary signal interface configured to:
   interface with the second RF amplifier; and
   provide the utility to enable the second RF amplifier via the auxiliary signal interface.

16. The multimode RF amplifier system of claim 15 wherein:
the utility provided to the second RF amplifier that is not used by the first RF amplifier is a first utility;
the auxiliary circuit further includes a second utility; and
the auxiliary circuit further comprises control circuitry and the auxiliary signal interface is configured to provide the second utility, wherein:
the auxiliary signal interface is configured to interface with the second RF amplifier; and
the control circuitry includes a control interface configured to interface with a master device, and configured to govern the second RF amplifier via the auxiliary signal interface.

17. The multimode RF amplifier system of claim 16 wherein the control interface includes a control bus interface configured to communicate with the master device.

18. The multimode RF amplifier system of claim 17 wherein the control bus interface includes a serial bus interface.

19. The multimode RF amplifier system of claim 17 wherein the control bus interface includes a parallel bus interface.

20. The multimode RF amplifier system of claim 16 wherein the control circuitry is further configured to govern an operation of the first RF amplifier.

21. The multimode RF amplifier system of claim 16 wherein the control interface comprises a mobile industry processor interface (MIPI) RF front-end (RFFE) control interface.

22. A radio frequency (RF) amplification device comprising:
a semiconductor die;
an RF power converter formed on the semiconductor die, wherein the RF power converter is configured to generate a regulated supply voltage from a power source voltage and a modulated supply voltage from the power source voltage;
a first RF amplification circuit formed on the semiconductor die, wherein the first RF amplification circuit is configured to amplify a first RF signal using the regulated supply voltage from the RF power converter; and
a second RF amplification circuit electromagnetically isolated from the RF power converter, wherein the second RF amplification circuit is configured to amplify a second RF signal using the modulated supply voltage from the RF power converter,
wherein operation of the first amplification circuit and the RF power converter are mutually exclusive such that:
when the first RF amplification circuit is ON, the RF power converter is OFF, and
when the RF power converter is ON, the first RF amplification circuit is OFF.

23. The RF amplification device of claim 22, wherein the second RF amplification circuit is coupled to the RF power converter so as to receive the modulated supply voltage.

24. The RF amplification device of claim 22 further comprising:
a second semiconductor die, wherein the second RF amplification circuit is formed on the second semiconductor die so as to be electromagnetically isolated from the RF power converter.

25. The RF amplification device of claim 22 wherein the RF power converter comprises:
a voltage regulation circuit configured to generate the regulated supply voltage from the power source voltage, wherein the voltage regulation circuit is formed on the semiconductor die; and
an RF switching converter configured to generate the modulated supply voltage from the power source voltage, wherein the RF switching converter is formed on the semiconductor die.

26. The RF amplification device of claim 25 further comprising a power controller formed on the semiconductor die, wherein the power controller is configured to:
enable the voltage regulation circuit;
disable the voltage regulation circuit;
enable the RF switching converter; and
disable the RF switching converter.

27. The RF amplification device of claim 22 wherein the second RF amplification circuit is formed on the semiconductor die such that the second RF amplification circuit is electromagnetically isolated from the RF power converter.

28. The RF amplification device of claim 27 wherein the RF power converter comprises an RF switching converter configured to generate the modulated supply voltage from the power source voltage, and the semiconductor die comprises:
a first active region comprising the RF power converter, wherein the first active region is formed on the semiconductor die;
a second active region comprising the second RF amplification circuit, wherein the second active region is formed on the semiconductor die such that the first active region and the second active region are electromagnetically isolated.

29. The RF amplification device of claim 28 wherein the second active region is discontinuous with the first active region and the second active region is separated from the first active region so as to electromagnetically isolate the second active region from the first active region.

30. The RF amplification device of claim 29 wherein the first active region further comprises the first RF amplification circuit.

31. The RF amplification device of claim 28 wherein the first active region and the second active region are each formed with a Bipolar Complementary Metal-Oxide Silicon (Bi-CMOS) technology.

32. The RF amplification device of claim 27 wherein the semiconductor die is a Silicon Germanium-type semiconductor die.

33. The multimode RF amplifier system of claim 1 further comprising a second semiconductor die, wherein the second RF amplifier is formed on the second semiconductor die.

* * * * *